(12) United States Patent
Kim et al.

(10) Patent No.: US 10,928,248 B2
(45) Date of Patent: *Feb. 23, 2021

(54) LIGHT FILTER AND SPECTROMETER INCLUDING THE SAME

(71) Applicant: SAMSUNG ELECTRONICS CO., LTD., Suwon-si (KR)

(72) Inventors: Jineun Kim, Suwon-si (KR); Younggeun Roh, Seoul (KR); Yeonsang Park, Seoul (KR); Hyochul Kim, Yongin-si (KR); Moonil Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

This patent is subject to a terminal disclaimer.

(21) Appl. No.: 16/288,752

(22) Filed: Feb. 28, 2019

(65) Prior Publication Data

US 2019/0277693 A1    Sep. 12, 2019

(30) Foreign Application Priority Data

Mar. 9, 2018 (KR) .......... 10-2018-0028293
Nov. 1, 2018 (KR) .......... 10-2018-0133136

(51) Int. Cl.
*G01J 3/18* (2006.01)
*G01J 3/45* (2006.01)
(Continued)

(52) U.S. Cl.
CPC ............ *G01J 3/1895* (2013.01); *G01J 3/021* (2013.01); *G01J 3/0205* (2013.01);
(Continued)

(58) Field of Classification Search
CPC .......... G01J 3/1895; G01J 3/26; G01J 3/2823; G01J 3/021; G01J 3/0205; G01J 3/0297;
(Continued)

(56) References Cited

U.S. PATENT DOCUMENTS 5,216,680 A    6/1993   Magnusson et al.
5,726,805 A *  3/1998   Kaushik .................... G01J 3/02
                                                       359/489.19

(Continued)

OTHER PUBLICATIONS

S. Boutami et al., "Photonic crystal slab reflectors for compact passive and active optical devices", vol. 6475, SPIE, XP040235802, Bellingham, WA, Mar. 7, 2007, 12 pages.

(Continued)

*Primary Examiner* — Dominic J Bologna
(74) *Attorney, Agent, or Firm* — Sughrue Mion, PLLC

(57) ABSTRACT

A light filter and a spectrometer including the light filter are disclosed. The light filter includes a plurality of filter units having different resonance wavelengths, wherein each of the plurality of filter units includes a cavity layer configured to output light of constructive interference, a Bragg reflection layer provided on a first surface of the cavity layer, and a pattern reflection layer provided on a second surface of the cavity layer opposite to the first surface and configured to cause guided mode resonance of light incident on the pattern reflection layer, the pattern reflection layer including a plurality of reflection structures that are periodically arranged.

16 Claims, 19 Drawing Sheets

(51) Int. Cl.
*G02B 5/28* (2006.01)
*G01J 3/26* (2006.01)
*G02B 5/20* (2006.01)
*G01J 3/28* (2006.01)
*G01J 3/02* (2006.01)
*H01L 27/146* (2006.01)
*H01L 31/0216* (2014.01)
*G02F 1/21* (2006.01)
*G01J 3/12* (2006.01)

(52) U.S. Cl.
CPC ........... *G01J 3/0256* (2013.01); *G01J 3/0297* (2013.01); *G01J 3/26* (2013.01); *G01J 3/2823* (2013.01); *G01J 3/45* (2013.01); *G02B 5/201* (2013.01); *G02B 5/28* (2013.01); *G02B 5/288* (2013.01); *G01J 2003/1226* (2013.01); *G01J 2003/2826* (2013.01); *G02F 2001/213* (2013.01); *H01L 27/14621* (2013.01); *H01L 31/02165* (2013.01)

(58) Field of Classification Search
CPC .... G01J 3/0256; G01J 3/45; G01J 2003/2826; G01J 2003/1226; G01J 3/28; G02B 5/201; G02B 5/288; G02B 5/28; G02B 5/1814; G02B 5/285; G02B 5/203; G02F 2001/213; H01L 27/14621; H01L 31/02165
See application file for complete search history.

(56) References Cited

U.S. PATENT DOCUMENTS

| 8,369,665 | B2 | 2/2013 | Fattal et al. | |
|---|---|---|---|---|
| 2002/0106160 | A1* | 8/2002 | Cox | H01S 5/18386 |
| | | | | 385/49 |
| 2004/0033003 | A1* | 2/2004 | Liu | G02B 6/124 |
| | | | | 385/14 |
| 2005/0018331 | A1* | 1/2005 | Pautet | G01J 3/26 |
| | | | | 359/885 |
| 2011/0188807 | A1* | 8/2011 | Fattal | G02B 6/124 |
| | | | | 385/37 |
| 2012/0268809 | A1 | 10/2012 | Guo et al. | |
| 2013/0170011 | A1 | 7/2013 | Cho et al. | |
| 2017/0059405 | A1* | 3/2017 | Huang | G01J 3/0218 |
| 2017/0059777 | A1 | 3/2017 | Han et al. | |

OTHER PUBLICATIONS

Yi-Chang et al., "FDTD and transfer matrix methods for evaluating the performance of photonic crystal based microwaves for exciton-polaritons", Semiconductor Science and Technology, vol. 31, No. 11, IOP Publishing Ltd., Great Britain, XP020309938, Oct. 14, 2016, pp. 1-8.

Yasuo Ohtera et al., "Photonic crystals for the application to spectrometers and wavelength filters", IEICE Electronics Express, vol. 10, No. 8, XP055166872, Apr. 25, 2013, pp. 1-13.

Communication dated Aug. 7, 2019, issued by the European Patent Office in counterpart European Application No. 19159547.9.

Yu Horie et al., "Wide bandwidth and high resolution planar filter array based on DBR-metasurface-DBR structures", Cornell University Library, arxiv.org, XP080964216, Apr. 12, 2016, pp. 1-6.

Pradeep Srinvasan et al., "Micro-optic-spectral-spatial-elements (mosse)", Proceedings of SPIE, vol. 7420, XP055649918, Aug. 20, 2009, 148 pages.

Stephane Collin et al., "Nanostructure arrays in free-space: optical properties and applications", Reports on Progress in Physics, vol. 77, No. 12, Institute of Physics Publishing, XP020273863, Nov. 26, 2014, 34 pages.

Communication dated Dec. 13, 2019 issued by the European Patent Office in counterpart European Application No. 19159547.9.

* cited by examiner

LIGHT FILTER AND SPECTROMETER INCLUDING THE SAME

CROSS-REFERENCE TO RELATED APPLICATIONS

This application claims priority from Korean Patent Application Nos. 10-2018-0028293 and 10-2018-0133136, filed on Mar. 9, 2018 and Nov. 1, 2018, respectively, in the Korean Intellectual Property Office, the disclosures of which are incorporated herein in their entirety by reference.

BACKGROUND

1. Field

Example embodiments of the present disclosure relate to a light filter and a spectrometer including the light filter.

2. Description of the Related Art

A spectrometer is an optical tool. Spectrometers of the related art include various optical elements, and thus are relatively bulky and heavy. In recent years, smaller spectrometers have been needed for in small-device applications such as smartphones or wearable devices. In particular, spectrometers having an on-chip structure may be smaller because integrated circuits and optical devices are all formed on one semiconductor chip, and thus on-chip spectrometers have been developed.

SUMMARY

One or more example embodiment provide light filters and spectrometers including the light filters.

Additional aspects will be set forth in part in the description which follows and, in part, will be apparent from the description, or may be learned by practice of example embodiments.

According to an aspect of an example embodiment, there is provided a light filter including a plurality of filter units having different resonance wavelengths, wherein each of the plurality of filter units includes a cavity layer configured to output light of constructive interference, a Bragg reflection layer provided on a first surface of the cavity layer, and a pattern reflection layer provided on a second surface of the cavity layer opposite to the first surface and configured to cause guided mode resonance of light incident on the pattern reflection layer, the pattern reflection layer including a plurality of reflection structures that are periodically provided.

The plurality of reflection structures may be periodically provided with a pitch less than a resonance wavelength of each of the plurality of filter units.

The resonance wavelength of each of the plurality of filter units may be determined by at least one of a pitch, a thickness, and a duty cycle of the plurality of reflection structures.

The plurality of reflection structures may be provided one-dimensionally.

The plurality of reflection structures may be provided as parallel lines.

The plurality of reflection structures may be provided two-dimensionally.

The plurality of reflection structures may be repeatedly provided in a polygonal pattern.

The Bragg reflection layer may include a plurality of material layers respectively having different refractive indexes that are alternately stacked.

The pattern reflection layer may further include a filling layer filled in gaps between the plurality of reflection structures, and a refractive index of the filling layer may be different from a refractive index of the plurality of reflection structures.

The pattern reflection layer may further include a cover layer covering the plurality of reflection structures, and a refractive index of the cover layer may be different from a refractive index of the plurality of reflection structures.

According to an aspect of another example embodiment, there is provided a light filter including a plurality of filter units having different resonance wavelengths, wherein each of the plurality of filter units include a cavity layer configured to output light of constructive interference, a first Bragg reflection layer provided on a first surface of the cavity layer, a second Bragg reflection layer provided on a second surface of the cavity layer opposite to the first surface, and a pattern reflection layer provided in the cavity layer and configured to cause guided mode resonance of light incident on the pattern reflection layer, the pattern reflection layer including a plurality of reflection structures that are periodically provided.

The plurality of reflection structures may be periodically provided with a pitch less than a resonance wavelength of each of the plurality of filter units.

The resonance wavelength of each the plurality of filter units may be determined by at least one of a pitch, a thickness, and a duty cycle of the plurality of reflection structures.

The plurality of reflection structures may be provided one-dimensionally or two-dimensionally.

Each of the first Bragg reflection layer and the second Bragg reflection layer may respectively include a plurality of material layers having different refractive indexes that are alternately stacked.

The plurality of reflection structures may be provided on a surface of the first Bragg layer adjacent to the first surface of the cavity layer or a surface of the second Bragg layer adjacent to the second surface of the cavity layer.

The plurality of reflection structures may be in contact with the first Bragg layer and the second Bragg layer.

According to an aspect of an example embodiment, there is provided a spectrometer including a light filter including a plurality of filter units, the plurality of filter units having different resonance wavelengths, and a sensing unit configured to receive light that has passed through the light filter, wherein each of the plurality of filter units includes a cavity layer configured to output light of constructive interference, a first Bragg reflection layer provided on a first surface of the cavity layer, and a pattern reflection layer including a plurality of reflection structures that are provided on a second surface of the cavity layer opposite to the first surface or included in the cavity layer, the pattern reflection layer being configured to cause guided mode resonance of light incident on the pattern reflection layer.

The plurality of reflection structures may be periodically provided with a pitch less than a resonance wavelength of each of the plurality of filter units.

The resonance wavelength of each of the plurality of filter unit may be determined by at least one of a pitch, a thickness, and a duty cycle of the plurality of reflection structures.

The plurality of reflection structures may be provided one-dimensionally or two-dimensionally.

The plurality of reflection structures may be provided on the second surface of the cavity layer, wherein the pattern reflection layer may further include a filling layer filled in gaps between the plurality of reflection structures, and a refractive index of the filling layer may be different from a refractive index of the plurality of reflection structures.

The plurality of reflection structures may be provided in the cavity layer, and each of the plurality of filter units may further include a second Bragg layer provided on the second surface of the cavity layer.

The sensing unit may include an image sensor or a photodiode.

The pattern reflection layer may further include a plurality of connection layers configured to connect adjacent reflection structures, and a thickness of the connection layer may be less than a thickness of the plurality of reflection structures.

The plurality of reflection structures may be in contact with the first Bragg layer and the second Bragg layer.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
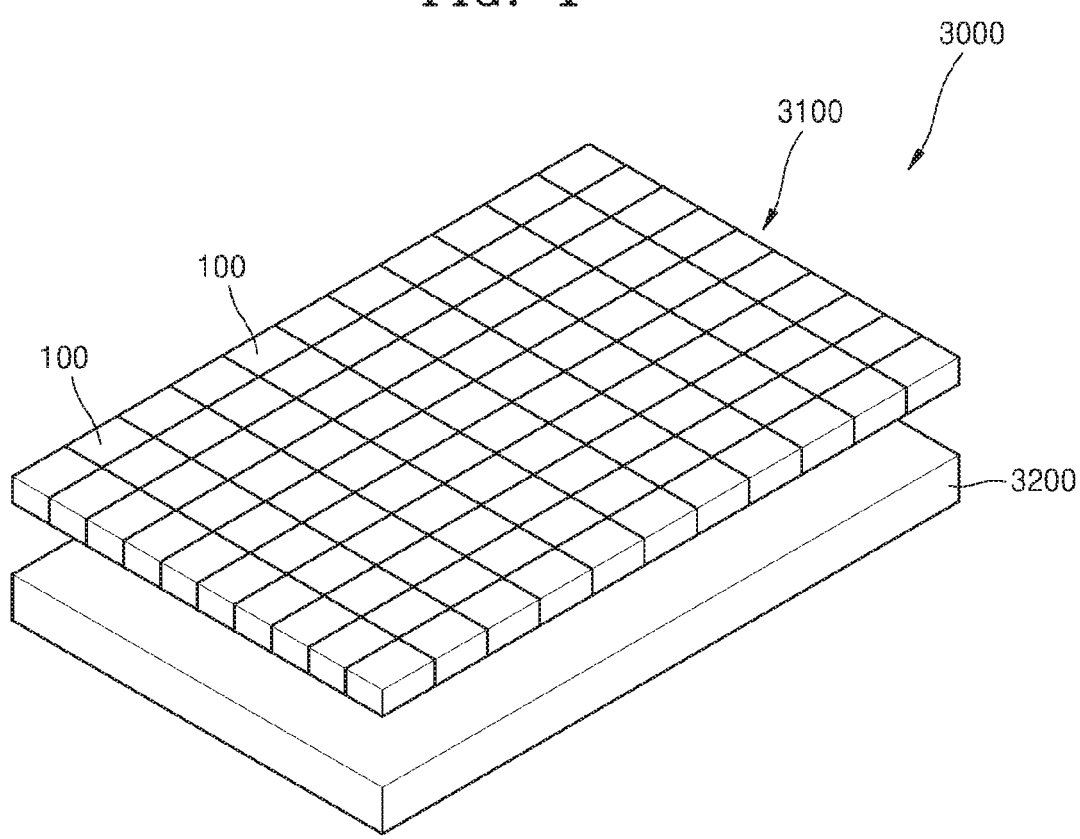
FIG. 1 is a perspective view schematically illustrating a spectrometer according to an example embodiment.

Reference will now be made in detail to example embodiments, examples of which are illustrated in the accompanying drawings, wherein like reference numerals refer to like elements throughout, and the sizes of elements may be exaggerated for clarity of illustration. In this regard, the present embodiments may have different forms and should not be construed as being limited to the descriptions set forth herein. Accordingly, example embodiments are merely described below, by referring to the figures, to explain aspects.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In the following description, when an element is referred to as being "above" or "on" another element, it may be directly on the other element while making contact with the other element or may be above the other element without making contact with the other element. The terms of a singular form may include plural forms unless specifically mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in appropriate order unless explicitly described in terms of order or described to the contrary. That is, operations are not limited to the order in which the operations are described. In the present disclosure, examples or exemplary terms (for example, "such as" and "etc.") are used for the purpose of description and are not intended to limit the scope of the inventive concept unless defined by the claims.

FIG. 1 is a perspective view illustrating schematically illustrating a spectrometer 3000 according to an example embodiment.

Referring to FIG. 1, the spectrometer 3000 includes a sensing device 3200 and a light filter 3100 provided on the sensing device 3200. The light filter 3100 may include a plurality of filter units 100 arranged in a two-dimensional array pattern. However, example embodiment are not limited thereto. For example, the filter units 100 may be arranged in a one-dimensional array pattern. The filter units 100 may have different resonance wavelengths. However, the filter units 100 are not limited thereto. For example, some of the filter units 100 may have the same resonance wavelength.

The sensing device 3200 may receive light having passed through the light filter 3100 and may convert the light into an electrical signal. After light incident on the light filter 3100 passes through the filter units 100, the light have different resonance wavelengths and reaches pixels of the sensing device 3200. Then, the sensing device 3200 converts the light incident on the pixels into an electrical signal. For example, the sensing device 3200 may include a photodiode or an image sensor such as a charge coupled device (CCD) image sensor or a complementary metal-oxide semiconductor (CMOS) image sensor.

Figure 2:
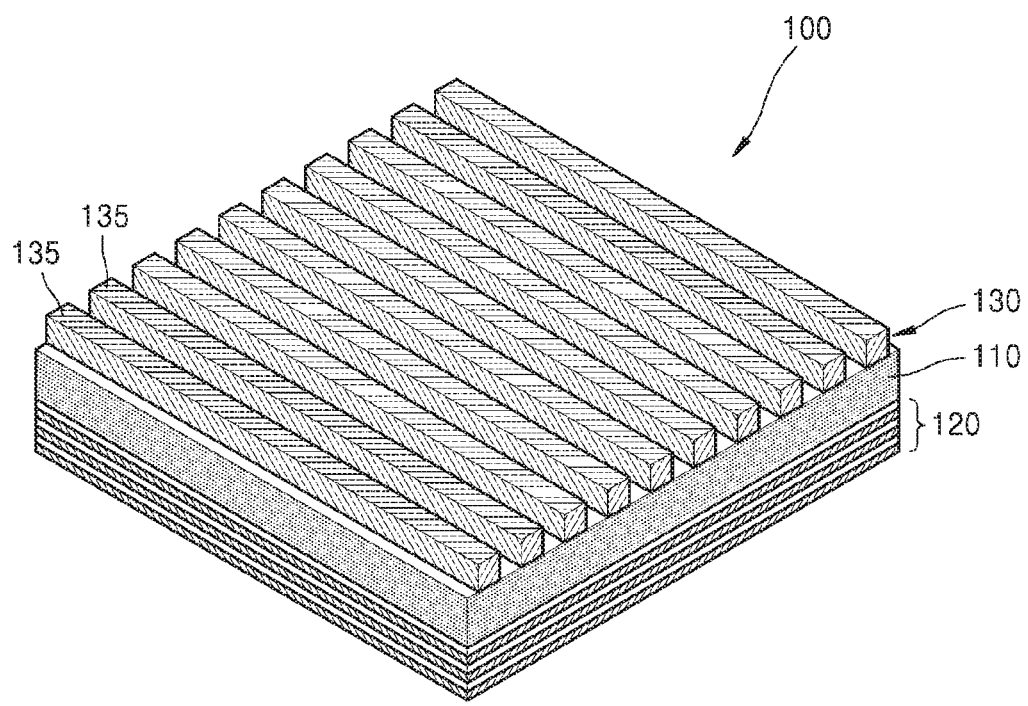
FIG. 2 is a perspective view illustrating a filter unit of a light filter shown in FIG. 1.
Figure 3:
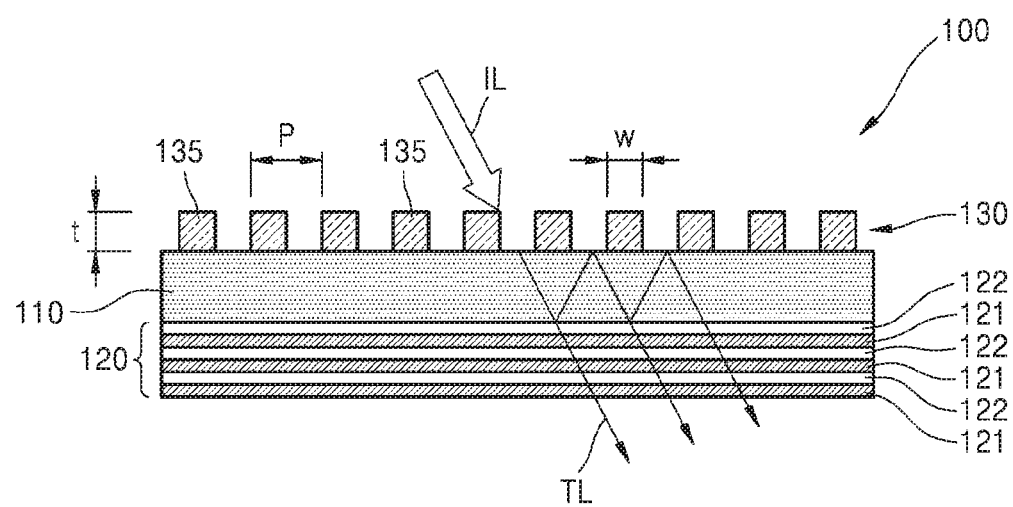
FIG. 3 is a cross-sectional view illustrating the filter unit shown in FIG. 2.

FIG. 2 is a perspective view illustrating a filter unit 100 of the light filter 3100 shown in FIG. 1, and FIG. 3 is a cross-sectional view illustrating the filter unit 100 shown in FIG. 2.

Referring to FIGS. 2 and 3, the filter unit 100 may include a cavity layer 110, a Bragg reflection layer 120 provided on a surface of the cavity layer 110, and a pattern reflection layer 130 provided on an opposite surface of the cavity layer 110.

The Bragg reflection layer 120 may be provided on a surface of the cavity layer 110, for example, a lower surface of the cavity layer 110. The Bragg reflection layer 120 may be a distributed Bragg reflector (DBR). The Bragg reflection layer 120 may have a structure in which a plurality of material layers having different refractive indexes are alternately stacked. The Bragg reflection layer 120 having such a structure may reflect light by periodic variations in refractive index.

FIG. 3 illustrates an example in which the Bragg reflection layer 120 includes first material layer 121 and second material layer 122 that have different refractive indexes and are each alternately stacked three times. The first and second material layers 121 and 122 may include semiconductor materials having different refractive indexes. For example, the first material layer 121 may include silicon dioxide ($SiO_2$) (refractive index=about 1.46), and the second material layer 122 may include silicon (Si) (refractive index=about 3.8). However, this is merely an example. For example, the first and second material layers 121 and 122 may include various other materials depending on design conditions such as the wavelength of incident light.

The pattern reflection layer 130 may be provided on an opposite surface of the cavity layer 110, for example, an upper surface of the cavity layer 110. Here, the pattern reflection layer 130 may increase reflectance in a narrow wavelength range by causing guide mode resonance (GMR). To this end, the pattern reflection layer 130 may have a grating structure configured to cause GMR. The pattern reflection layer 130 may include a plurality of reflection structures 135 that are periodically arranged at regular intervals on the upper surface of the cavity layer 110. In this example, the reflection structures 135 may be arranged with a pitch P less than a resonance wavelength corresponding to the filter unit 100.

In the example embodiment, the reflection structures 135 of the pattern reflection layer 130 may be arranged on the upper surface of the cavity layer 110 in a one-dimensional pattern. For example, each of the reflection structures 135 may have a line shape having a width (w) and a thickness (t), and the reflection structures 135 may be arranged in one direction with a pitch (P) and may be parallel to each other. FIG. 3 illustrates an example in which each of the reflection structures 135 has a tetragonal cross-sectional shape. However, this is merely an example. For example, each of the reflection structures 135 may have other polygonal cross-sectional shape such as a triangular cross-sectional shape.

The reflection structures 135 may include a semiconductor material having a given refractive index. For example, the reflection structures 135 may include Si (refractive index=about 3.8). However, this is a non-limiting example. For example, the reflection structures 135 may include a material such as gallium arsenide (GaAs), gallium phosphide (GaP), silicon nitride (SiN) or titanium dioxide ($TiO_2$). In addition, the reflection structures 135 may include various materials depending on design conditions such as the wavelength of incident light.

In the example embodiment, the resonance wavelengths of each of the filter units 100 of the light filter 3100 may be determined by at least one of the pitch (P), thickness (t), and duty cycle of the reflection structures 135. Therefore, the filter units 100 having different resonance wavelengths may be more easily implemented by varying at least one of the pitch (P), thickness (t), and duty cycle of the reflection structures 135 of the pattern reflection layers 130.

The cavity layer 110 may be provided between the Bragg reflection layer 120 and the pattern reflection layer 130. The cavity layer 110 may include a material having a refractive index less than the reflection structures 135 of the pattern reflection layer 130. For example, the cavity layer 110 may include $SiO_2$ (refractive index=about 1.46). However, this is merely an example. For example, the cavity layer 110 may include various materials depending on design conditions such as the wavelength of incident light.

In this structure, light IL entering the cavity layer 110 from an upper surface of the filter unit 100 may travel in the cavity layer 110 between the Bragg reflection layer 120 and the pattern reflection layer 130 while experiencing constructive interference and destructive interference. Then, light TL having a resonance wavelength satisfying constructive interference conditions of the cavity layer 110 may exit the filter unit 100 through a lower surface of the filter unit 100. That is, the cavity layer 110 is configured to output light of a given resonance wavelength.

According to the example embodiment, since the filter unit 100 includes the pattern reflection layer 130 having a grating structure capable of causing GMR, reflectance may be increased in a narrow wavelength range. Therefore, variations in resonance wavelength caused by variations in the incident angle of light IL on the filter unit 100 may be reduced. In addition, the filter units 100 having different resonance wavelengths may be more easily implemented by varying the pitch (P), thickness (t), or duty cycle of the reflection structures 135 of the pattern reflection layers 130. Therefore, the light filter 3100 may be fabricated through a simpler process at lower costs and in a shorter period of time.

Figure 4:
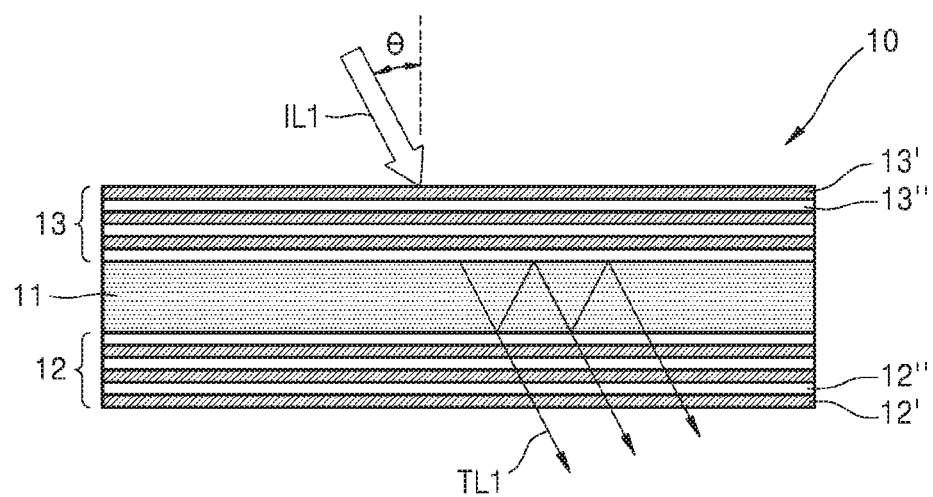
FIG. 4 is a view illustrating a filter unit of the related art as an example model.

FIG. 4 is a view illustrating a filter unit 10 of the related art as an example model.

In the filter unit 10 of the related art shown in FIG. 4, a first Bragg reflection layer 12 and a second Bragg reflection layer 13 are respectively provided on a lower surface and an upper surface of a cavity layer 11. In the example, the first and second Bragg reflection layers 12 and 13 include $SiO_2$ layers (thickness=about 145 nm, refractive index=about 1.46) as first material layers 12' and 13', and Si layers (thickness=about 56 nm, refractive index=about 3.8) as second material layers 12" and 13". In each of the first and second Bragg reflection layers 12 and 13, the $SiO_2$ layers and the Si layers are each alternately stacked three times, and the cavity layer 11 includes an SiO$_2$ layer (thickness=about 290 nm, refractive index=about 1.46).

In this structure, light IL1 incident on the cavity layer 11 travels in the cavity layer 11 while being reflected between the first and second Bragg reflection layers 12 and 13. Then, light TL1 having a given resonance wavelength is output to the outside through the first Bragg reflection layer 12.

Figure 5:
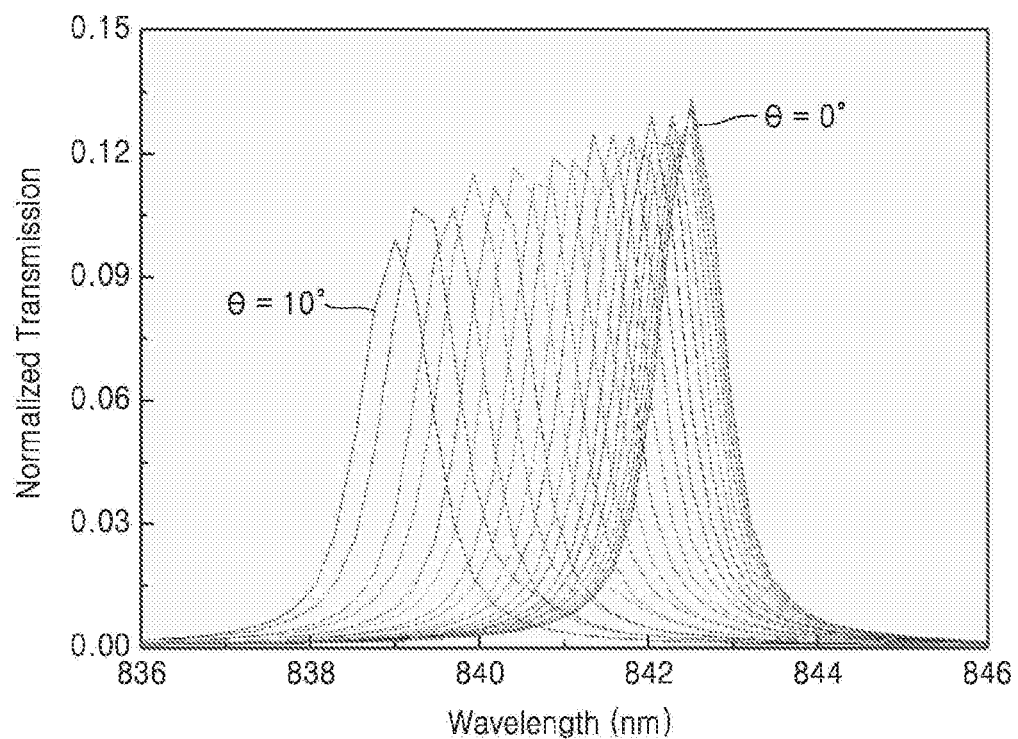
FIG. 5 is a view illustrating simulation results of transmission spectra of the filter unit shown in FIG. 4.

FIG. 5 is a view illustrating simulation results of transmission spectra of the filter unit 10 shown in FIG. 4. FIG. 5 illustrates transmission spectra calculated while sequentially varying the incident angle θ of light IL1 on the filter unit 10 from 0° to 10°.

Referring to FIG. 5, in the filter unit 10 of the related art in which the first and second Bragg reflection layers 12 and 13 are respectively provided on the lower and upper surfaces of the cavity layer 11, the resonance wavelength was significantly varied with variations in the incident angle of light IL1. When the resonance wavelength significantly varies with variations in the incident angle of light IL1, the full width at half maximum (FWHM) in transmission spectrum may increase, and thus the resolution of a spectrometer may deteriorate.

Figure 6:
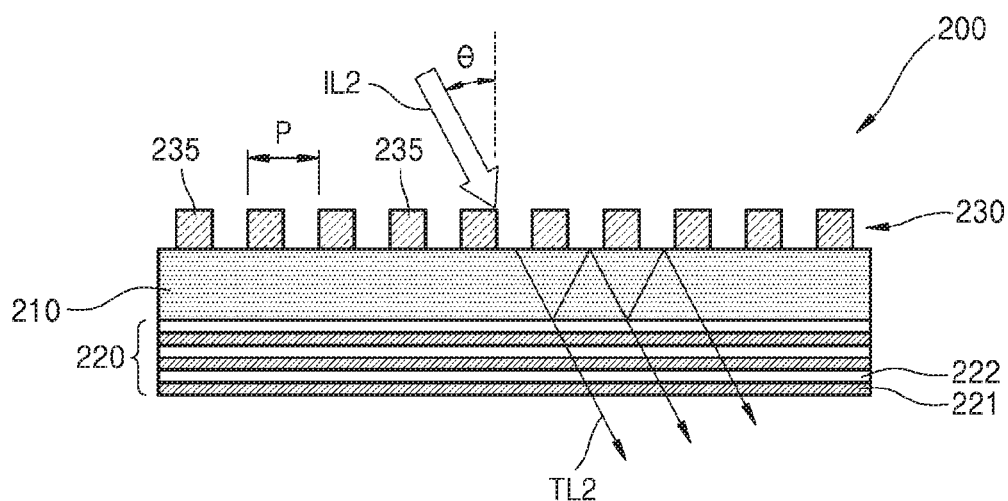
FIG. 6 is a view illustrating an example model of the filter unit of the embodiment shown in FIG. 2.

FIG. 6 is a view illustrating an example model 200 of the filter unit 100 of the example embodiment shown in FIG. 2. Referring to FIG. 6, a Bragg reflection layer 220 includes SiO$_2$ layers (thickness=about 145 nm, refractive index=about 1.46) as first material layers 221 and Si layers (thickness=about 56 nm, refractive index=about 3.8) as second material layers 222. The SiO$_2$ layers and the Si layers are each alternately stacked three times, and a cavity layer 210 includes an SiO$_2$ layer (thickness=about 290 nm, refractive index=about 1.46). In addition, each of reflection structures 235 may include Si with a filling ratio of about 0.5 (thickness=about 200 nm, refractive index=about 3.8), and other configurations of the filter unit 200 may be the same as the filter unit 100 shown in FIG. 3.

Figure 7A:
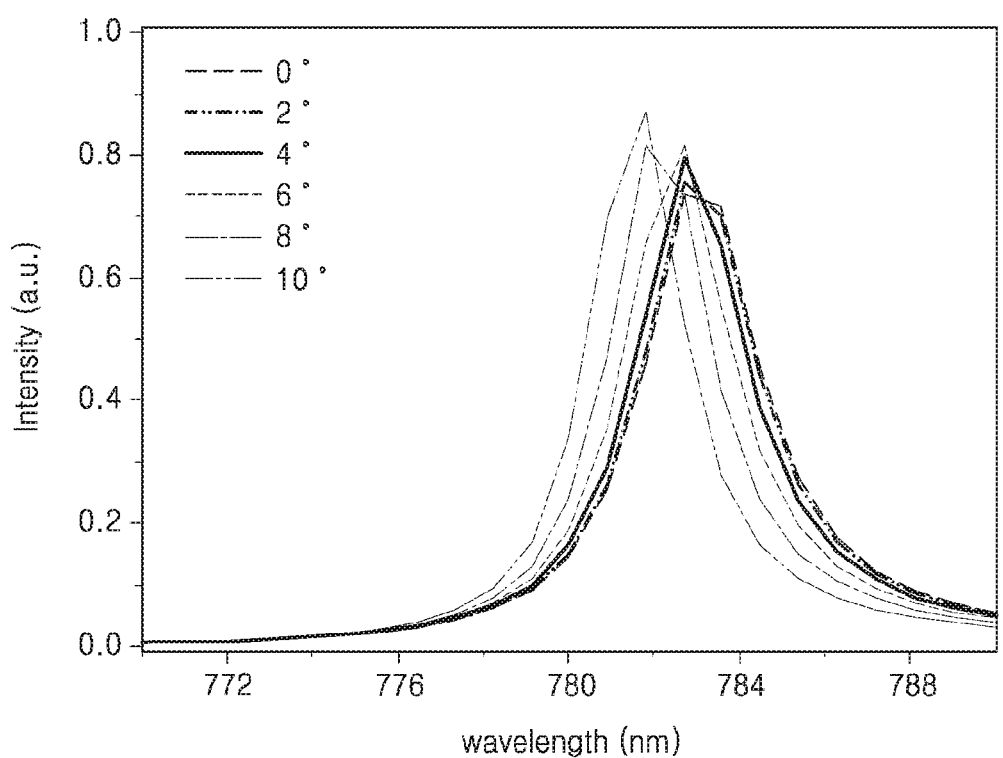
FIGS. 7A, 7B, and 7C are views illustrating simulation results of transmission spectra of the filter unit shown in FIG. 6.
Figure 7B:
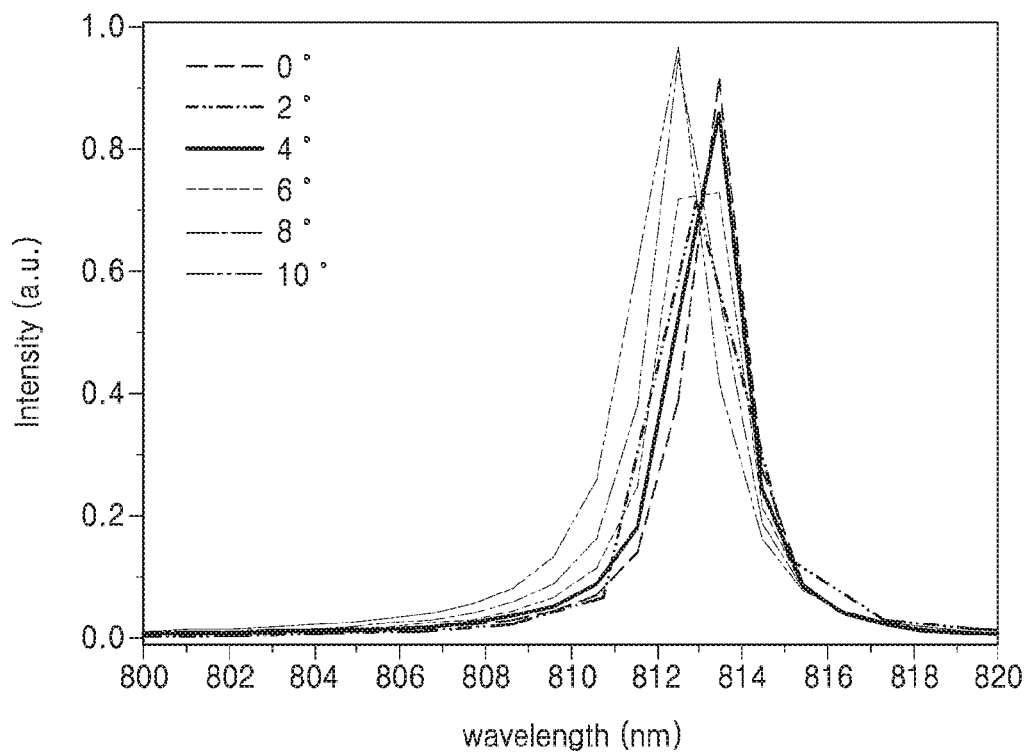
Figure 7C:
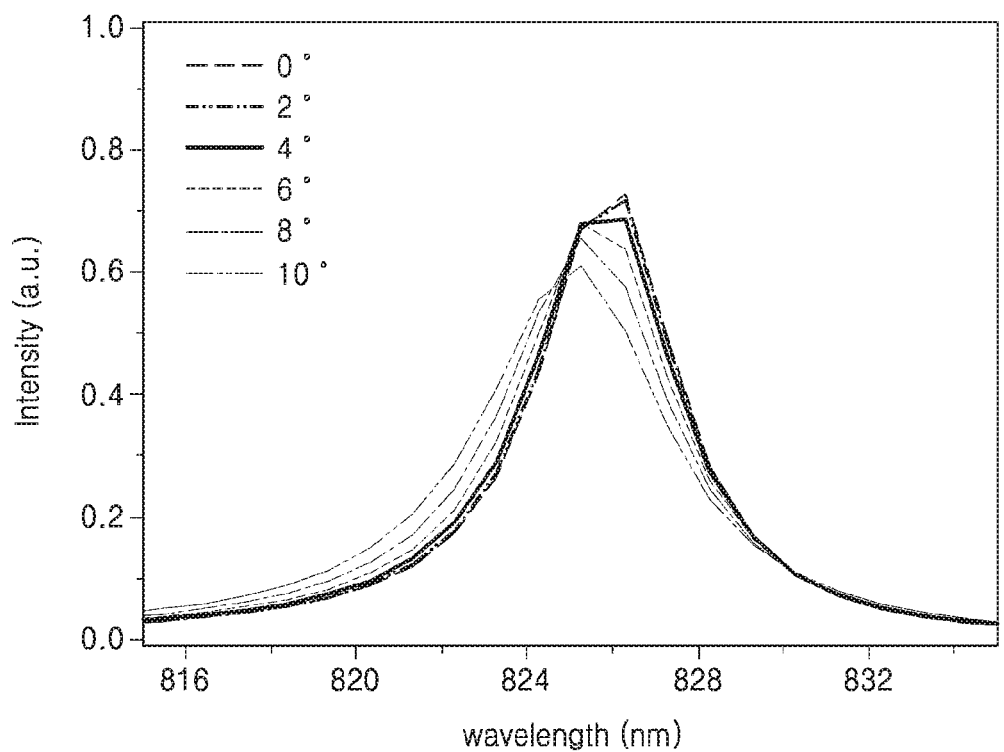

FIGS. 7A to 7C are views illustrating simulation results of transmission spectra of the filter unit 200 shown in FIG. 6.

FIG. 7A illustrates transmission spectra calculated while varying the incident angle θ of light IL2 on the filter unit 200 from 0° to 2°, 4°, 6°, 8°, and 10° under the condition that the reflection structures 235 of the filter unit 200 have a pitch (P) of 280 nm.

Referring to FIG. 7A, when the incident angle θ of light IL2 was 0°, the resonance wavelength was 782.68 nm, and when the incident angle θ of light IL2 was varied from 0° to 10°, the resonance wavelength was varied by about 0.89 nm. In addition, light TL2 having passed through the filter unit 200 had a maximum intensity of about 0.872 and an FWHM of about 3.19 nm.

FIG. 7B illustrates transmission spectra calculated while varying the incident angle θ of light IL2 on the filter unit 200 from 0° to 2°, 4°, 6°, 8°, and 10° under the condition that the reflection structures 235 of the filter unit 200 have a pitch (P) of 320 nm.

Referring to FIG. 7B, when the incident angle θ of light IL2 was 0°, the resonance wavelength was 813.47 nm, and when the incident angle θ of light IL2 was varied from 0° to 10°, the resonance wavelength was varied by about 0.97 nm. In addition, light TL2 having passed through the filter unit 200 had a maximum intensity of about 0.968 and an FWHM of about 1.41 nm.

FIG. 7C illustrates transmission spectra calculated while varying the incident angle θ of light IL2 on the filter unit 200 from 0° to 2°, 4°, 6°, 8°, and 10° under the condition that the reflection structures 235 of the filter unit 200 have a pitch (P) of 340 nm.

Referring to FIG. 7C, when the incident angle θ of light IL2 was 0°, the resonance wavelength was 825.88 nm, and when the incident angle θ of light IL2 was varied from 0° to 10°, the resonance wavelength was varied by about 1.0 nm. In addition, light TL2 having passed through the filter unit 200 had a maximum intensity of about 0.72 and an FWHM of about 3.8 nm.

Referring to the results shown in FIGS. 7A to 7C, it could be understood that the resonance wavelength varies less although the incident angle θ of light IL2 on the filter unit 200 shown in FIG. 6 is varied, and a higher resolution is obtained due to a smaller FWHM.

Figure 8:
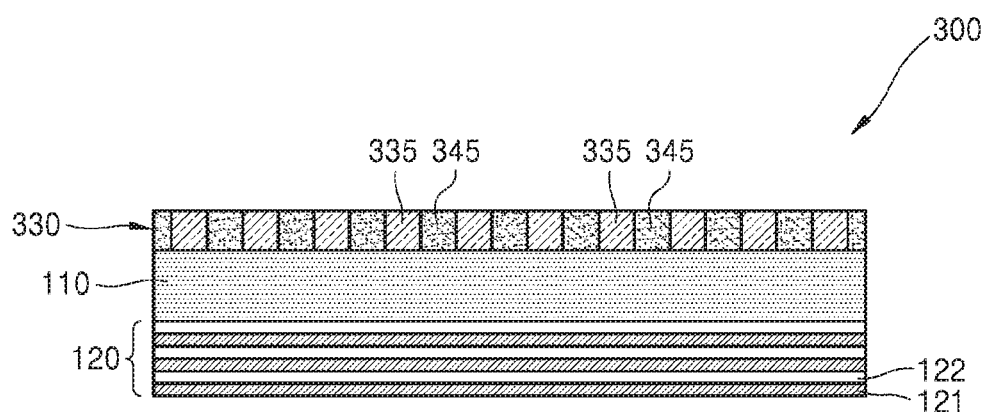
FIG. 8 is a view illustrating a filter unit according to an example embodiment.

FIG. 8 is a view illustrating a filter unit 300 according to an example embodiment.

Referring to FIG. 8, the filter unit 300 includes a cavity layer 110, a Bragg reflection layer 120 provided on a surface of the cavity layer 110, and a pattern reflection layer 330 provided on an opposite surface of the cavity layer 110. The Bragg reflection layer 120 may have a structure in which a plurality of material layers having different refractive indexes are alternately stacked. FIG. 8 illustrates an example in which the Bragg reflection layer 120 includes first and second material layers 121 and 122 that have different refractive indexes and are each alternately stacked three times.

The pattern reflection layer 330 may increase reflectance in a narrow wavelength range by causing GMR. To this end, the pattern reflection layer 330 may have a grating structure configured to cause GMR. The pattern reflection layer 330 may include a plurality of reflection structures 335 periodically arranged at given intervals, and a filling layer 345 filled in gaps between the reflection structures 335. The reflection structures 335 may be arranged on an upper surface of the cavity layer 110 in a one-dimensional pattern. Each of the reflection structures 335 may have a line shape having a width and a thickness, and the reflection structures 335 may be arranged in one direction with a given pitch in parallel to each other.

The reflection structures 335 may be arranged with a pitch less than a resonance wavelength corresponding to the filter unit 300. Each of the reflection structures 335 may have a polygonal cross-sectional shape such as a tetragonal or triangular cross-sectional shape and may include a semiconductor material having a given refractive index. However, example embodiments are not limited thereto. The reflection structures 335 may include various materials depending on design conditions such as the wavelength of incident light.

The filling layer 345 may be provided on the upper surface of the cavity layer 110 to fill gaps between the reflection structures 335. The filling layer 345 may have the same thickness as the reflection structures 335. However, the filling layer 345 is not limited thereto. For example, the filling layer 345 may be thinner than the reflection structures 335. The filling layer 345 may include a material having a refractive index different from the refractive index of the reflection structures 335.

The filling layer 345 may include a material having a refractive index less than the refractive index of the reflection structures 335. For example, the reflection structures 335 may include a relatively high reflective index material such as Si, GaAs, GaP, SiN, or TiO$_2$, and the filling layer 345 may include a material such as SiO$_2$, a polymer-based material (SU-8, PMMA), or hydrogen silsesquioxane (HSQ) having a refractive index less than the refractive index of the reflection structures 335. However, this is merely an example. The reflection structures 335 and the filling layer 345 may include various materials other than the above-listed materials.

In the above, it is described that the reflection structures 335 include a material having a refractive index greater than the refractive index of the filling layer 345. However, this is a non-limiting example. For example, the reflection structures 335 may include a material having a refractive index less than the refractive index of the filling layer 345.

According to the example embodiment, since the filter unit 300 includes the pattern reflection layer 330 having a grating structure capable of causing GMR, reflectance may be increased in a narrow wavelength range, and thus variations in resonance wavelength caused by variations in the incident angle of light on the filter unit 300 may be reduced. In addition, since the resonance wavelength of the filter unit 300 may be determined by varying the pitch, thickness, or duty cycle of the reflection structures 335 of the pattern reflection layer 330, a light filter including filter units 300 having different resonance wavelengths may be more easily fabricated.

Figure 9:
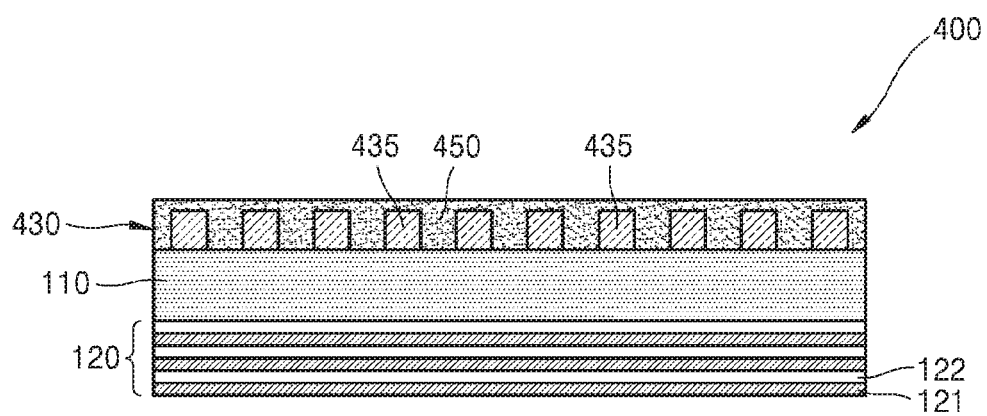
FIG. 9 is a view illustrating a filter unit according to an example embodiment.

FIG. 9 is a view illustrating a filter unit 400 according to an example embodiment.

Referring to FIG. 9, the filter unit 400 includes a cavity layer 110, a Bragg reflection layer 120 provided on a surface of the cavity layer 110, and a pattern reflection layer 430 provided on an opposite surface of the cavity layer 110. The pattern reflection layer 430 may have a grating structure configured to cause GMR. The pattern reflection layer 430 may include a plurality of reflection structures 435 periodically arranged at given intervals, and a cover layer 450 covering the reflection structures 435.

The cover layer 450 may be provided on an upper surface of the cavity layer 110 to cover and encapsulate the reflection structures 435. The cover layer 450 may include a material having a refractive index different from the refractive index of the reflection structures 435. For example, the cover layer 450 may include a material having a refractive index less than the refractive index of the reflection structures 435. However, this is a non-limiting example. For example, the reflection structures 435 may include a material having a refractive index less than the refractive index of the cover layer.

The other structures shown in FIG. 9 are described in the previous example embodiments, and thus descriptions thereof will not be repeated here.

Figure 10:
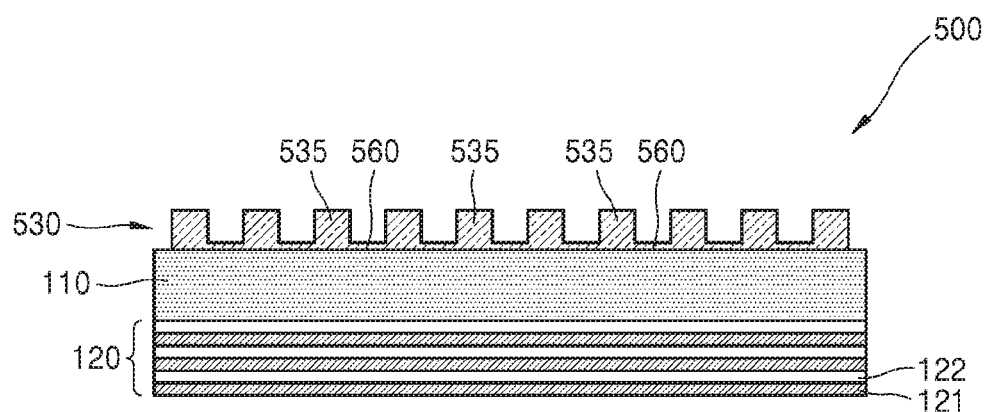
FIG. 10 is a view illustrating a filter unit according to an example embodiment.

FIG. 10 is a view illustrating a filter unit 500 according to an example embodiment.

Referring to FIG. 10, the filter unit 500 includes a cavity layer 110, a Bragg reflection layer 120 provided on a surface of the cavity layer 110, and a pattern reflection layer 530 provided on an opposite surface of the cavity layer 110. The pattern reflection layer 530 may have a grating structure capable of causing GMR. The pattern reflection layer 530 may include a plurality of reflection structures 535 periodically arranged at given intervals, and a connection layer 560 connecting the reflection structures 535.

The connection layer 560 may be provided on an upper surface of the cavity layer 110 to connect the adjacent reflection structures 535. The connection layer 560 may have a thickness that is less than the thickness of the reflection structures 535. The connection layer 560 may be provided in one piece with the reflection structures 535 and may include the same material that the reflection structures 535 include.

The other structures shown in FIG. 10 are described in the previous example embodiments, and thus descriptions thereof will not be repeated here.

Figure 11:
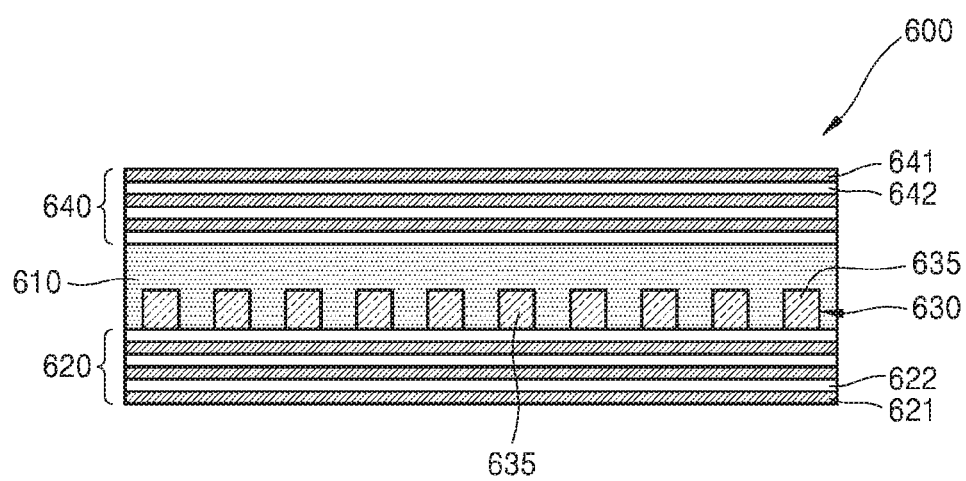
FIG. 11 is a view illustrating a filter unit according to an example embodiment.

FIG. 11 is a view illustrating a filter unit 600 according to an example embodiment.

Referring to FIG. 11, the filter unit 600 includes a cavity layer 610, a first Bragg reflection layer 620 provided on a surface of the cavity layer 610, a second Bragg reflection layer 640 provided on an opposite surface of the cavity layer 610, and a pattern reflection layer 630 provided in the cavity layer 610.

The first and second Bragg reflection layers 620 and 640 may respectively be provided on a lower surface and an upper surface of the cavity layer 610. Each of the first and second Bragg reflection layers 620 and 640 may have a structure in which a plurality of material layers having different refractive indexes are alternately stacked. In the example shown in FIG. 11, the first Bragg reflection layer 620 includes first material layer 621 and second material layer 622 having different refractive indexes, and the second Bragg reflection layer 640 includes first material layer 641 and second material layer 642 having different refractive indexes. In this case, the first material layers 621 and 641 and the second material layers 622 and 642 may include various materials depending on design conditions such as the wavelength of incident light. The first and second Bragg reflection layers 620 and 640 having such a structure may reflect light by periodic variations in refractive index.

The cavity layer 610 is provided between the first and second Bragg reflection layers 620 and 640, and the pattern reflection layer 630 may be provided in the cavity layer 610. Here, the pattern reflection layer 630 may be provided on an inner surface (that is, an upper surface) of the first Bragg reflection layer 620.

The pattern reflection layer 630 may cause GMR and may include a plurality of reflection structures 635 provided in the cavity layer 610 and periodically arranged at regular intervals on the upper surface of the first Bragg reflection layer 620. Here, the reflection structures 635 may be arranged with a pitch less than a resonance wavelength corresponding to the filter unit 600.

The reflection structures 635 of the pattern reflection layer 630 may be arranged in a one-dimensional pattern similar to the reflection structures 135 shown in FIG. 2. For example, each of the reflection structures 635 may have a line shape having a width and a thickness, and the reflection structures 635 may be arranged in one direction with a given pitch in parallel to each other. In addition, although the reflection structures 635 shown in FIG. 11 have a tetragonal cross-sectional shape, this is a non-limiting example. For example, each of the reflection structures 635 may have any other polygonal cross-sectional shape.

The reflection structures 635 may include a semiconductor material having a given refractive index. For example, the reflection structures 635 may include a material having a refractive index greater than the refractive index of the cavity layer 610. The reflection structures 635 may include various materials depending on design conditions such as the wavelength of incident light.

In this structure of the filter unit 600, light entering the cavity layer 610 through the second Bragg reflection layer 640 may travel between the second Bragg reflection layer 640 and the pattern reflection layer 630, and after travelling in the cavity layer 610, light having a given resonance wavelength may be output to the outside through the pattern reflection layer 630 and the first Bragg reflection layer 620.

According to the example embodiment, since the pattern reflection layer 630 causing GMR is provided in the cavity layer 610 of the filter unit 600, reflectance may be increased in a narrow wavelength range. Therefore, variations in resonance wavelength caused by variations in the incident angle of light on the filter unit 600 may be reduced. In addition, filter units 600 having different resonance wavelengths may be implemented by varying the pitch, thickness, or duty cycle of the reflection structures 635 of the pattern reflection layer 630, and thus it may be possible to simplify manufacturing processes of a light filter and reduce manufacturing costs and time.

Figure 12:
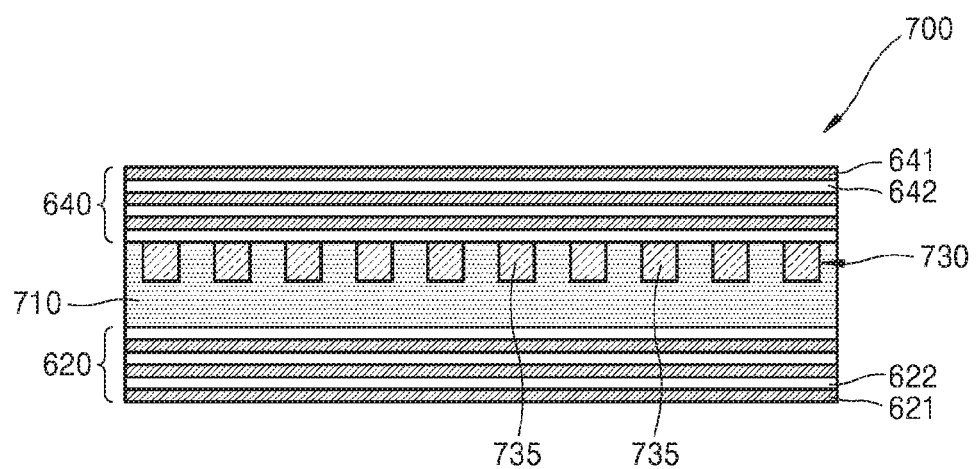
FIG. 12 is a view illustrating a filter unit according to an example embodiment.

FIG. 12 is a view illustrating a filter unit 700 according to an example embodiment. The filter unit 700 shown in FIG. 12 is the same as the filter unit 600 shown in FIG. 11 except that a pattern reflection layer 730 is provided on an inner surface of a second Bragg reflection layer 640.

Figure 13:
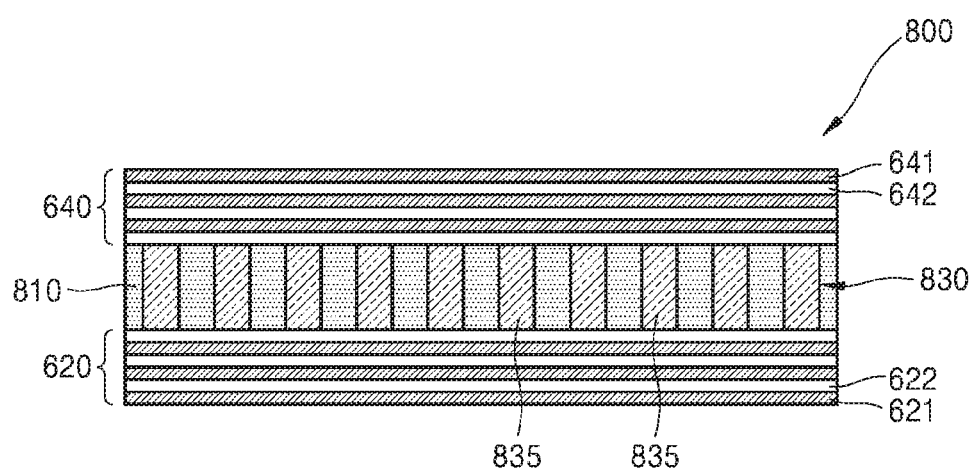
FIG. 13 is a view illustrating a filter unit according to an example embodiment.

FIG. 13 is a view illustrating a filter unit 800 according to an example embodiment. The filter unit 800 shown in FIG. 13 is the same as the filter unit 600 shown in FIG. 11 except that a pattern reflection layer 830 is in contact with both of the inner surfaces of first and second Bragg reflection layers 620 and 640.

Figure 14A:
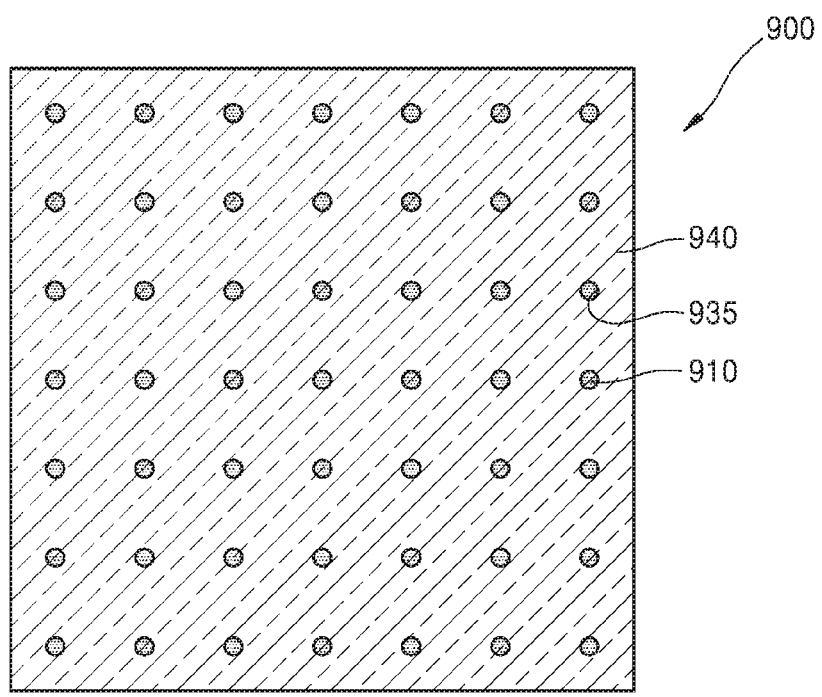
FIGS. 14A and 14B are views illustrating a filter unit according to an example embodiment.
Figure 14B:
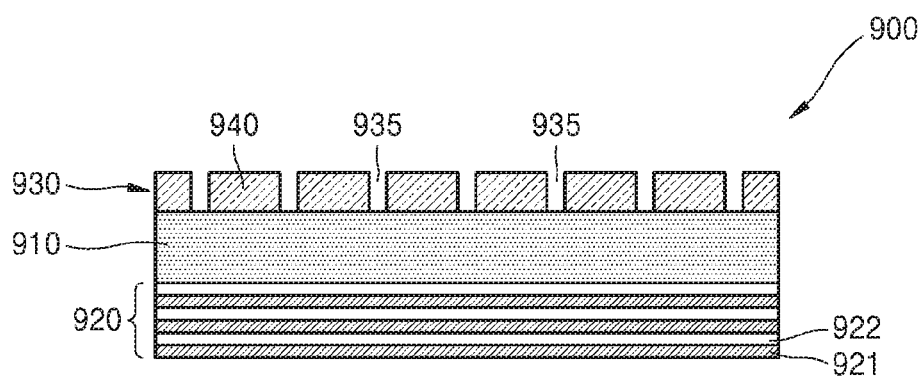

FIG. 14A is a plan view illustrating a filter unit 900 according to an example embodiment, and FIG. 14B is a cross-sectional view illustrating the filter unit 900 shown in FIG. 14A.

Referring to FIGS. 14A and 14B, the filter unit 900 includes a cavity layer 910, a Bragg reflection layer 920 provided on a surface of the cavity layer 910, and a pattern reflection layer 930 provided on an opposite surface of the cavity layer 910.

For example, when the Bragg reflection layer 920 is provided on a lower surface of the cavity layer 910, the pattern reflection layer 930 may be provided on an opposite surface of the cavity layer 910, for example, an upper surface of the cavity layer 910. Here, the pattern reflection layer 930 may increase reflectance in a narrow wavelength range by causing GMR. To this end, the pattern reflection layer 930 includes a pattern material layer 940 and a plurality of holes 935 periodically formed in the pattern material layer 940.

The pattern material layer 940 may include a semiconductor material having a given refractive index. For example, the pattern material layer 940 may include Si (refractive index=about 3.8). However, this is a non-limiting example. For example, the pattern material layer 940 may include a material such as GaAs, GaP, SiN or $TiO_2$. In addition, the pattern material layer 940 may include various materials depending on design conditions such as the wavelength of incident light.

The holes 935 may be arranged on the upper surface of the cavity layer 910 in a two-dimensional pattern. Referring to FIGS. 14A and 14B, each of the holes 935 has a circular cross-sectional shape, and the holes 935 are periodically arranged in a tetragonal pattern on the upper surface of the cavity layer 910. Here, the holes 935 may be arranged with a pitch less than a resonance wavelength corresponding to the filter unit 900. In addition, referring to FIGS. 14A and 14B, the holes 935 penetrate the pattern material layer 940. However, this is a non-limiting example. For example, the holes 935 may not penetrate the pattern material layer 940.

The cavity layer 910 may be provided between the Bragg reflection layer 920 and the pattern reflection layer 930. The cavity layer 910 may include a material having a less refractive index than the pattern material layer 940 of the pattern reflection layer 930. For example, the cavity layer 910 may include $SiO_2$ (refractive index=about 1.46). However, this is merely an example. For example, the cavity layer 910 may include various materials depending on design conditions such as the wavelength of incident light.

In this structure of the filter unit 900, light entering the cavity layer 910 from the outside of the filter unit 900 may travel in the cavity layer 910 between the Bragg reflection layer 920 and the pattern reflection layer 930, and thus, light having a given resonance wavelength may be output to the outside through the Bragg reflection layer 920.

As described above, since the holes 935 of the pattern reflection layer 930 causing GMR are periodically arranged in a two-dimensional pattern, reflectance may increase in a narrow wavelength range, and thus variations in resonance wavelength caused by variations in the incident angle of light on the filter unit 900 may be reduced. According to example embodiments in which structures causing GMR are periodically arranged in a one-dimensional pattern, the effect of reducing variations in resonance wavelength may be obtained only for light having polarization in one direction. In the example embodiment, where structures causing GMR are arranged in a two-dimensional pattern, the effect of reducing variations in resonance wavelength may be obtained for light having polarization in all directions.

In addition, filter units 900 having different resonance wavelengths may be more easily implemented by varying the pitch, thickness, or duty cycle of the holes 935 of the pattern reflection layer 930, and thus it may be possible to simplify manufacturing processes of a light filter and reduce manufacturing costs and time.

Figure 15:
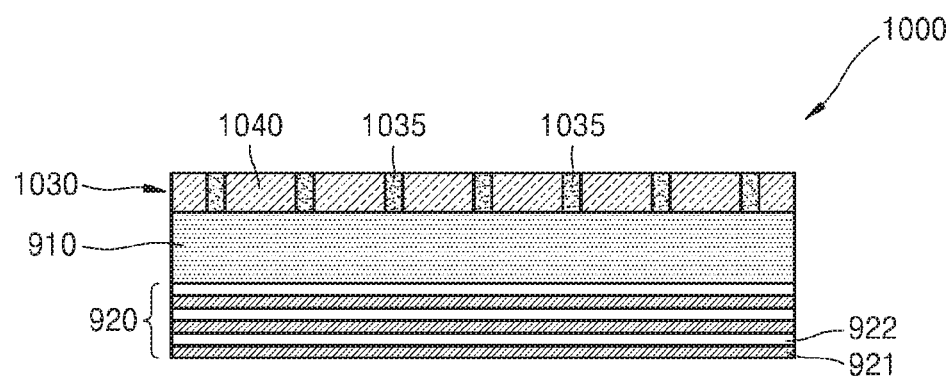
FIG. 15 is a view illustrating a filter unit according to an example embodiment.

FIG. 15 is a cross-sectional view illustrating a filter unit 1000 according to another example embodiment. The filter unit 1000 shown in FIG. 15 is the same as the filter unit 900 shown in FIGS. 14A and 14B except that a filling layer 1035 is filled in a plurality of holes of a pattern material layer 1040.

Referring to FIG. 15, a pattern reflection layer 1030 includes a pattern material layer 1040 and the filling layer 1035 filled in the holes periodically formed in the pattern material layer 1040. In this example, the filling layer 1035 may have a thickness equal to or less than the thickness of the pattern material layer 1040. The filling layer 1035 may include a material having a refractive index different from the refractive index of the pattern material layer 1040. That is, the filling layer 1035 may include a material having a refractive index greater than or less than the refractive index of the pattern material layer 1040.

Figure 16:
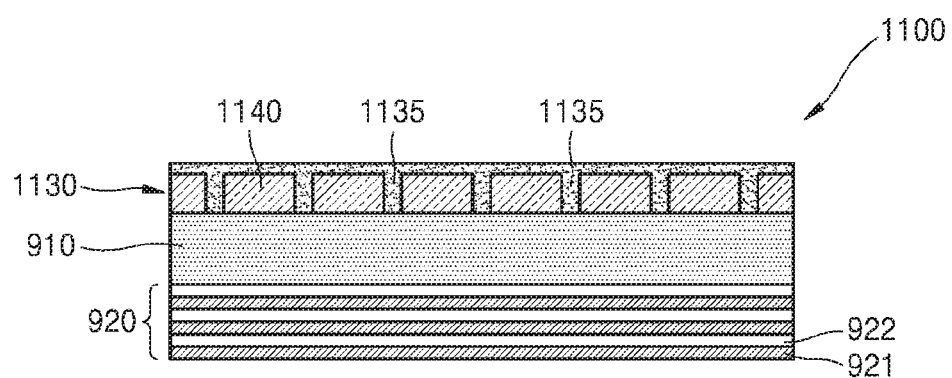
FIG. 16 is a view illustrating a filter unit according to an example embodiment.

FIG. 16 is a cross-sectional view illustrating a filter unit 1100 according to an example embodiment. The filter unit 1100 shown in FIG. 16 is the same as the filter unit 900 shown in FIGS. 14A and 14B except that a cover layer 1135 covers holes of a pattern material layer 1140 of a pattern reflection layer 1130.

Figure 17:
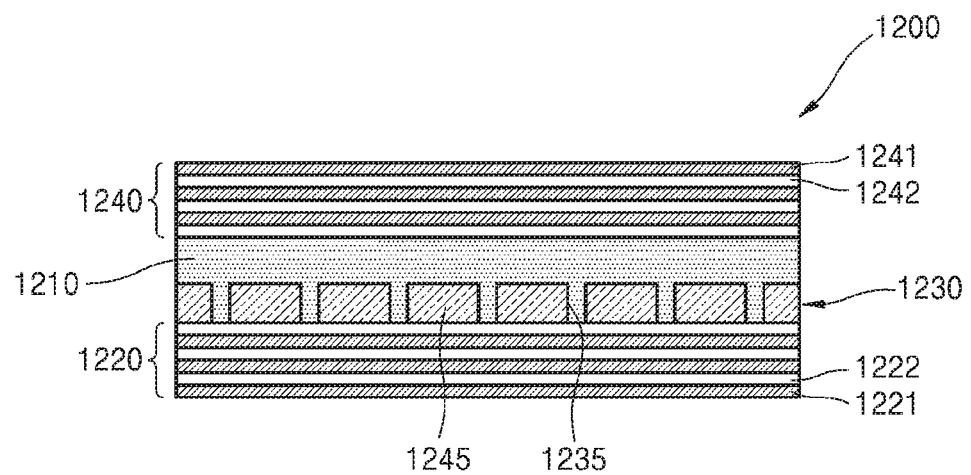
FIG. 17 is a view illustrating a filter unit according to an example embodiment.

FIG. 17 is a cross-sectional view illustrating a filter unit 1200 according to an example embodiment.

Referring to FIG. 17, the filter unit 1200 includes: a cavity layer 1210, a first Bragg reflection layer 1220 including first material layer 1221 and second material layer 1222 provided on a surface of the cavity layer 1210, a second Bragg reflection layer 1240 including first material layer 1241 and second material layer 1242 provided on an opposite surface of the cavity layer 1210, and a pattern reflection layer 1230 provided in the cavity layer 1210.

The pattern reflection layer 1230 includes a pattern material layer 1245 and a plurality of holes 1235 periodically formed in the pattern material layer 1245. The holes 1235 may be filled with the cavity layer 1210.

The pattern material layer 1245 may include a semiconductor material having a given refractive index. In addition, the holes 1235 may be arranged in a two-dimensional pattern on an upper surface of the first Bragg reflection layer 1220. In this case, the holes 1235 may have various shapes and may be arranged in a two-dimensional pattern. Here, the holes 1235 may be arranged with a pitch less than a resonance wavelength corresponding to the filter unit 1200. In addition, referring to FIG. 17, the holes 1235 may penetrate the pattern material layer 1245. However, this is a non-limiting example. For example, the holes 1235 may not penetrate the pattern material layer 1245.

Furthermore, in the example embodiment, the pattern reflection layer 1230 is provided in the cavity layer 1210 on an inner surface (that is, the upper surface) of the first Bragg reflection layer 1220. However, the pattern reflection layer 1230 may be provided in the cavity layer 1210 on an inner surface (that is, a lower surface) of the second Bragg reflection layer 1240.

The other structures shown in FIG. 17 are described in the previous example embodiments, and thus descriptions thereof will not be repeated here.

Figure 18:
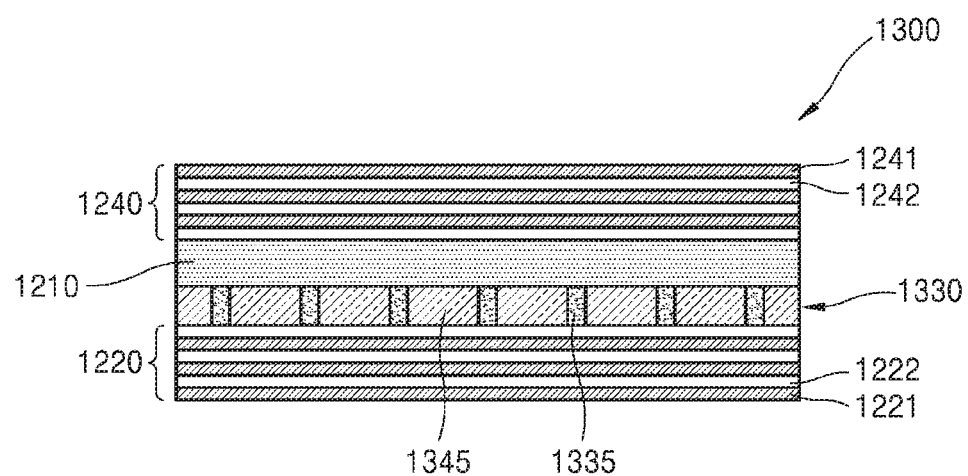
FIG. 18 is a view illustrating a filter unit according to an example embodiment.

FIG. 18 is a cross-sectional view illustrating a filter unit 1300 according to an example embodiment. The filter unit 1300 shown in FIG. 18 is the same as the filter unit 1200 shown in FIG. 17 except that a filling layer 1335 is filled in holes of a pattern material layer 1345 of a pattern reflection layer 1330.

Figure 19:
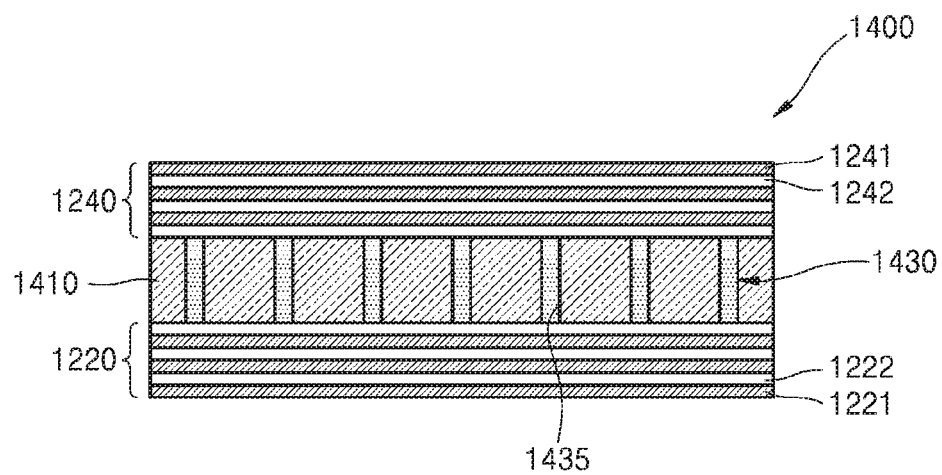
FIG. 19 is a view illustrating a filter unit according to an example embodiment.

FIG. 19 is a cross-sectional view illustrating a filter unit 1400 according to an example embodiment.

Referring to FIG. 19, the filter unit 1400 includes a cavity layer 1410, a first Bragg reflection layer 1220 provided on a lower surface of the cavity layer 1410, a second Bragg reflection layer 1240 provided on an upper surface of the cavity layer 1410, and a pattern reflection layer 1430 including reflection structures 1435 provided in the cavity layer 1410. Here, the pattern reflection layer 1430 may be in contact with the upper surface of the first Bragg reflection layer 1220 and the lower surface of the second Bragg reflection layer 1240.

The other structures shown in FIG. 19 are described in the previous example embodiments, and thus descriptions thereof will not be repeated here.

Figure 20A:
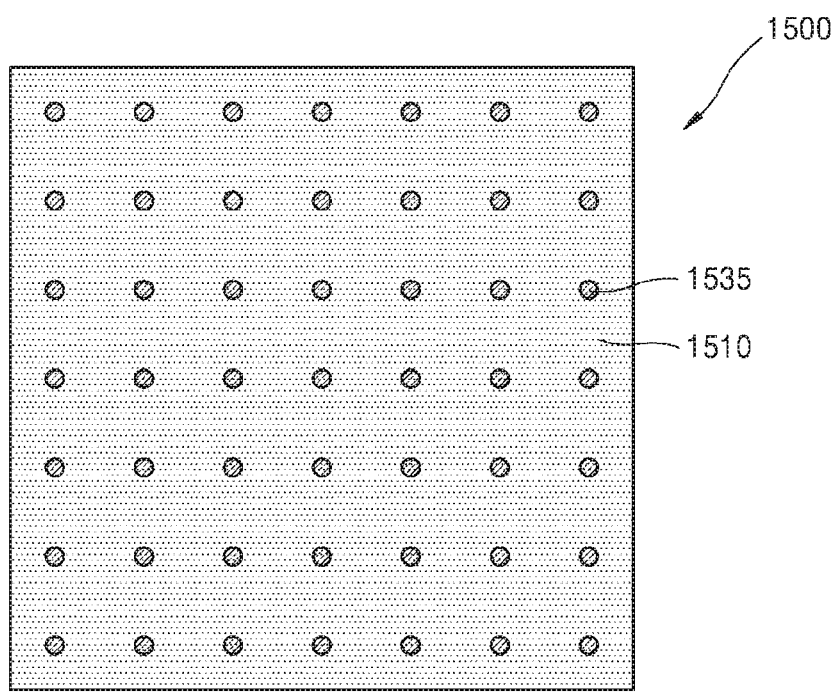
FIGS. 20A and 20B are views illustrating a filter unit according to an example embodiment.
Figure 20B:
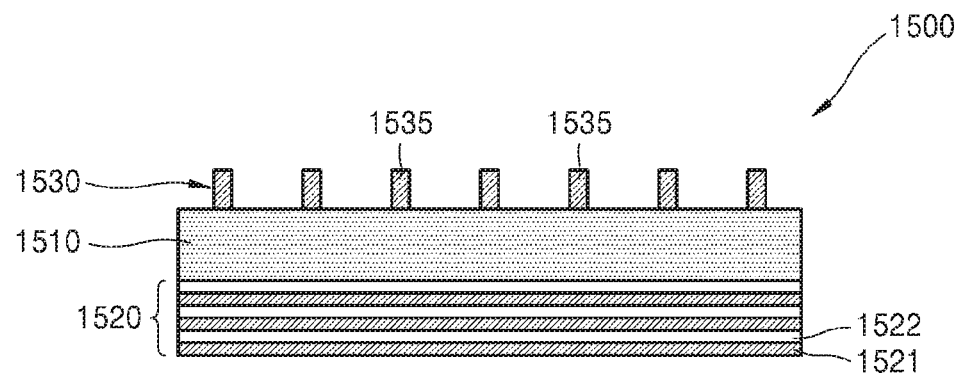

FIG. 20A is a plan view illustrating a filter unit 1500 according to an example embodiment, and FIG. 20B is a cross-sectional view illustrating the filter unit 1500 shown in FIG. 20A.

Referring to FIGS. 20A and 20B, the filter unit 1500 includes a cavity layer 1510, a Bragg reflection layer 1520 including first material layer 1521 and second material layer 1522 provided on a lower surface of the cavity layer 1510, and a pattern reflection layer 1530 provided on an upper surface of the cavity layer 1510.

A plurality of reflection structures 1535 may be arranged on the upper surface of the cavity layer 1510 in a two-dimensional pattern. Referring to FIGS. 20A and 20B, each of the reflection structures 1535 has a circular flat surface, and the reflection structures 1535 are periodically arranged in a tetragonal pattern on the upper surface of the cavity layer 1510. Here, the reflection structures 1535 may be arranged with a pitch less than a resonance wavelength corresponding to the filter unit 1500. The cavity layer 1510 may be provided between the Bragg reflection layer 1520 and the pattern reflection layer 1530. The cavity layer 1510 may include a material having a refractive index less than the refractive index of the reflection structures 1535.

As described above, since the reflection structures 1535 of the pattern reflection layer 1530 causing GMR are periodically arranged in a two-dimensional pattern, reflectance may increase in a narrow wavelength range, and thus variations in resonance wavelength caused by variations in the incident angle of light on the filter unit 1500 may be reduced. In addition, since the reflection structures 1535 causing GMR are arranged in a two-dimensional pattern, variations in resonance wavelength may be reduced for light having polarization in all directions.

The other structures shown in FIGS. 20A and 20B are described in the previous example embodiments, and thus descriptions thereof will not be repeated here.

Figure 21A:
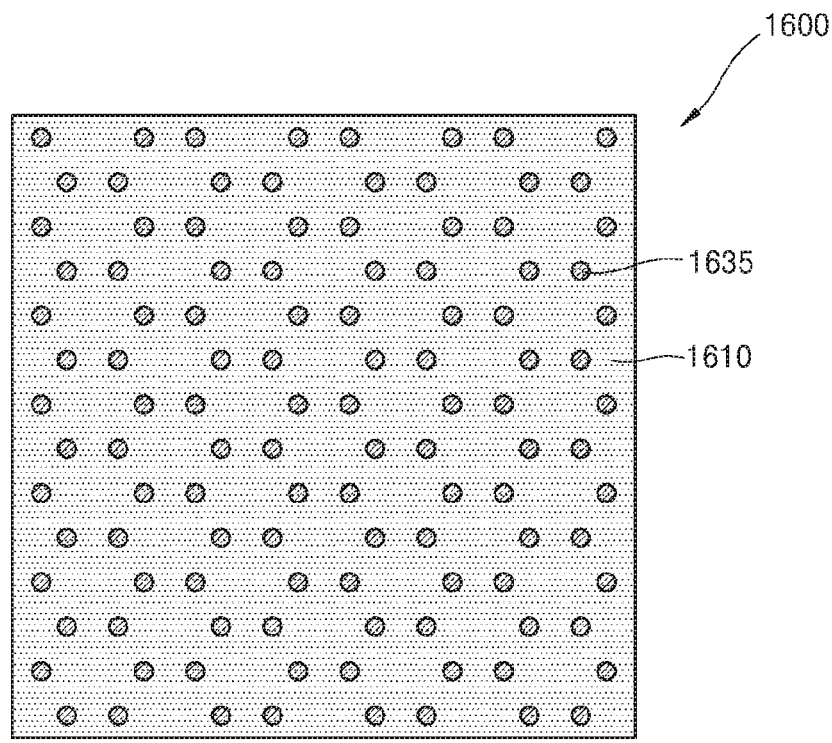
FIGS. 21A and 21B are views illustrating a filter unit according to an example embodiment.
Figure 21B:
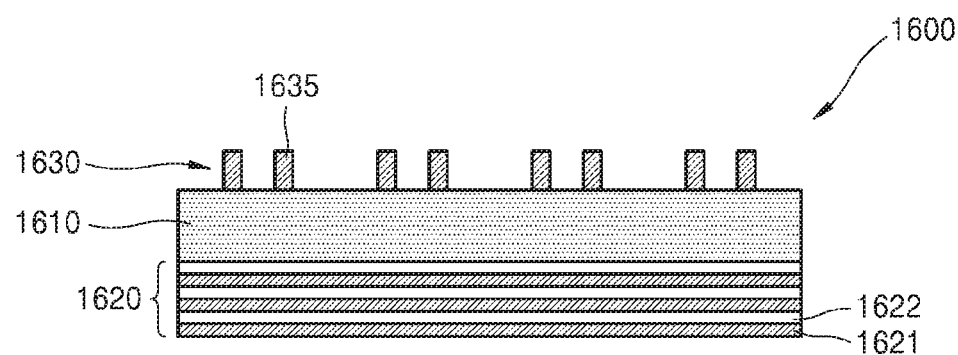

FIG. 21A is a plan view illustrating a filter unit 1600 according to an example embodiment, and FIG. 21B is a cross-sectional view illustrating the filter unit 1600 shown in FIG. 21A. Referring to FIGS. 21A and 21B, the filter unit 1600 includes a cavity layer 1610, a Bragg reflection layer 1620 including first second material layer 1621 and second material layer 1622 on a lower surface of the cavity layer 1610, and a pattern reflection layer 1630 provided on an upper surface of the cavity layer 1610. The filter unit 1600 shown in FIGS. 21A and 21B is the same as the filter unit 1500 shown in FIGS. 20A and 20B except that reflection structures 1635 of the pattern reflection layer 1630 are arranged in a two-dimensional hexagonal pattern.

Figure 22A:
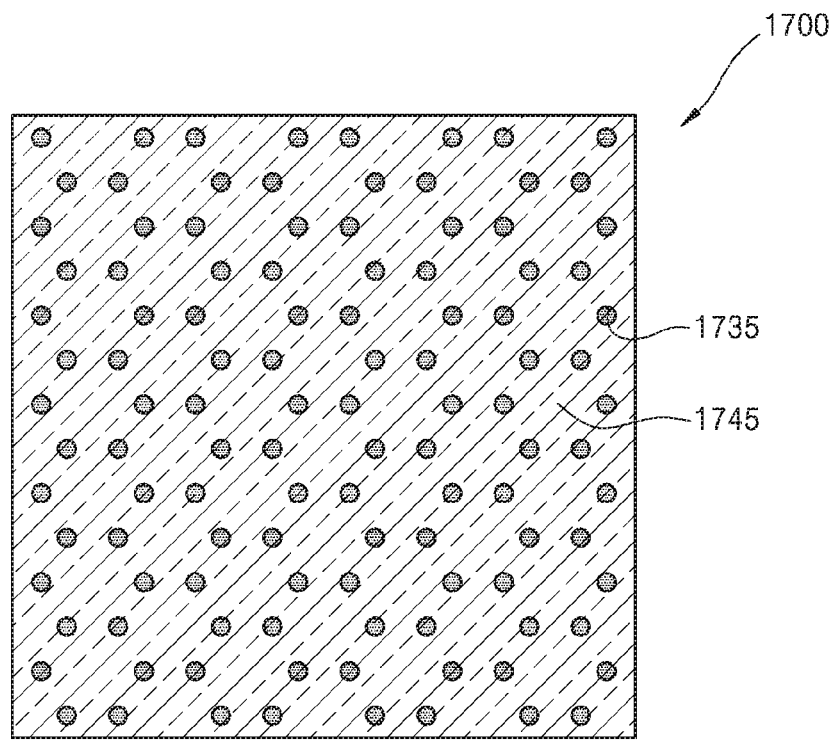
FIGS. 22A and 22B are views illustrating a filter unit according to an example embodiment.
Figure 22B:
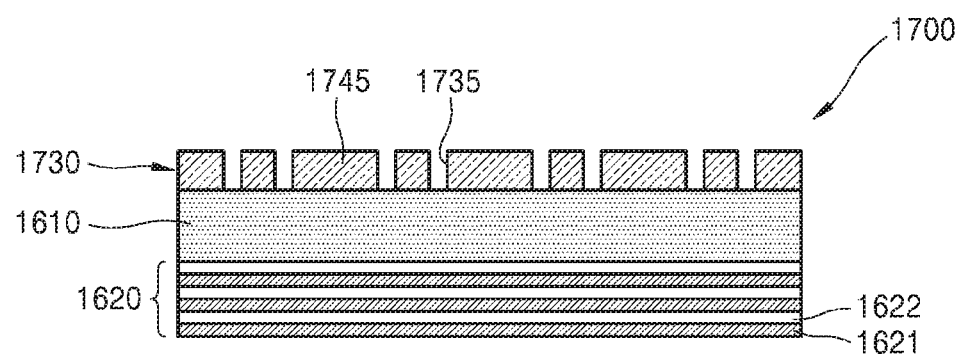

FIG. 22A is a plan view illustrating a filter unit 1700 according to an example embodiment, and FIG. 22B is a cross-sectional view illustrating the filter unit 1700 shown in FIG. 20A. The filter unit 1700 shown in FIGS. 22A and 22B is the same as the filter unit 900 shown in FIGS. 14A and 14B except that holes 1735 formed in a pattern material layer 1745 of a pattern reflection layer 1730 are arranged in a two-dimensional hexagonal pattern.

Figure 23A:
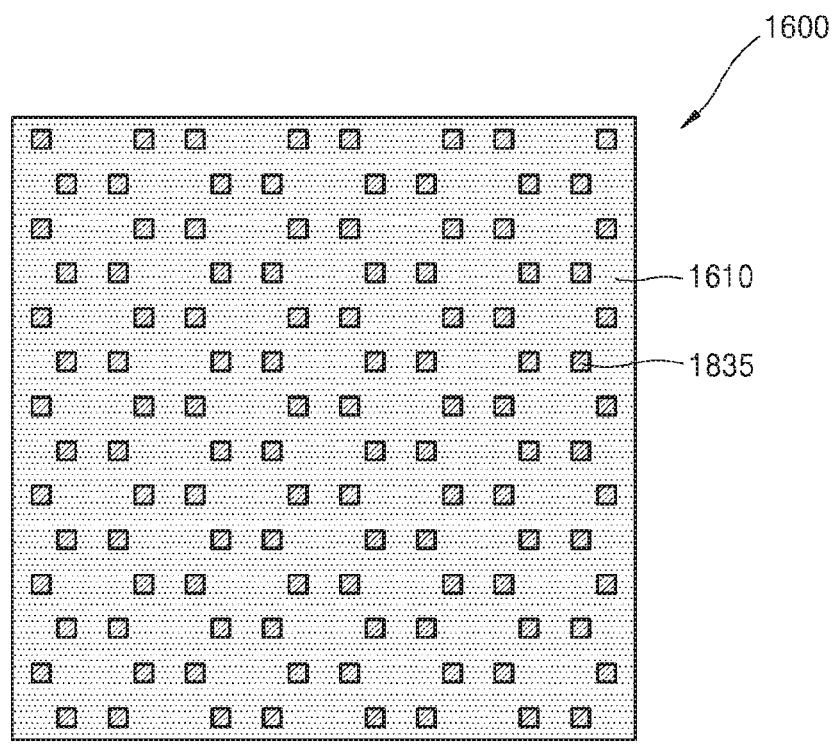
FIGS. 23A and 23B are views illustrating a filter unit according to an example embodiment.
Figure 23B:
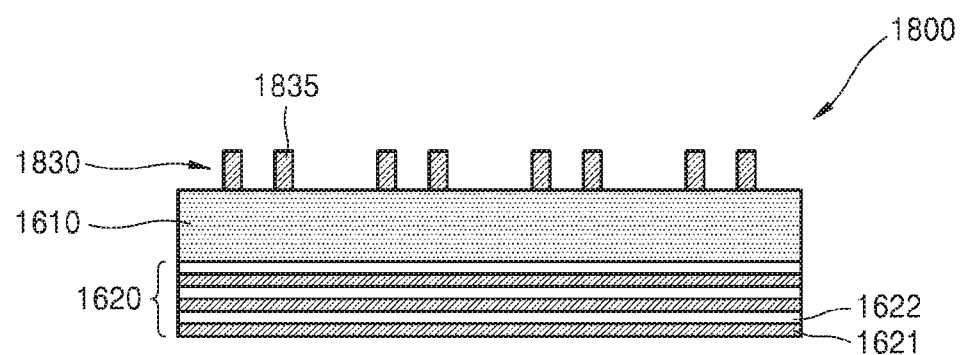

FIG. 23A is a plan view illustrating a filter unit 1800 according to an example embodiment, and FIG. 23B is a cross-sectional view illustrating the filter unit 1800 shown in FIG. 23A. The filter unit 180 shown in FIGS. 23A and 23B is the same as the filter unit 1600 shown in FIGS. 21A and 21B except that each of reflection structures 1835 of a pattern reflection layer 1830 has a tetragonal flat surface.

Figure 24A:
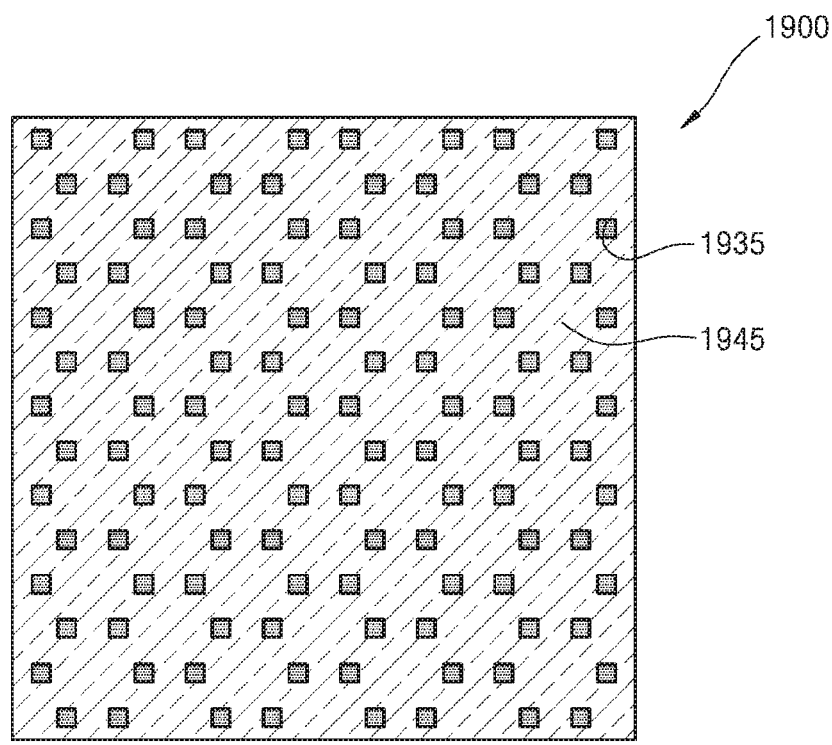
FIGS. 24A and 24B are views illustrating a filter unit according to an example embodiment.
Figure 24B:
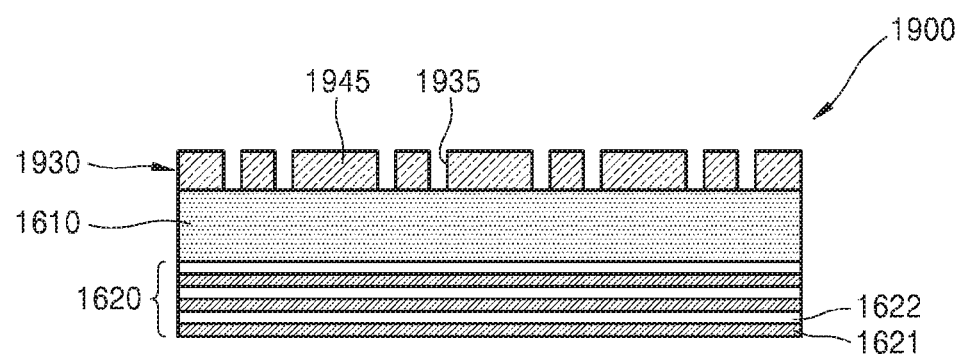

FIG. 24A is a plan view illustrating a filter unit 1900 according to an example embodiment, and FIG. 24B is a cross-sectional view illustrating the filter unit 1900 shown in FIG. 20A. The filter unit 1900 shown in FIGS. 24A and 24B is the same as the filter unit 1700 shown in FIGS. 22A and 22B except that each of holes 1935 formed in a pattern material layer 1945 has a tetragonal cross-sectional shape.

Figure 25A:
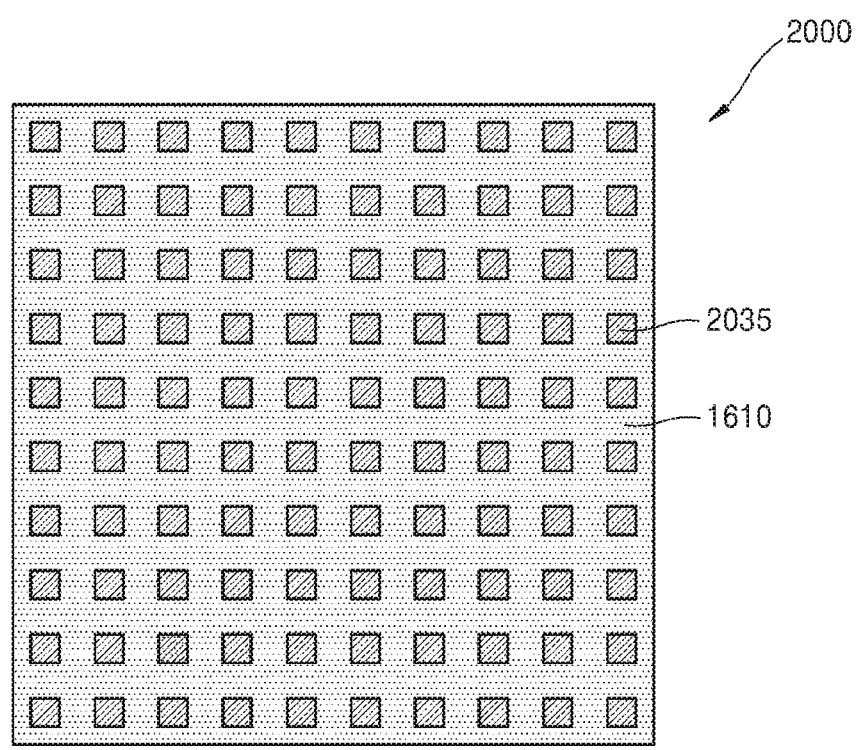
FIGS. 25A and 25B are views illustrating a filter unit according to an example embodiment.
Figure 25B:
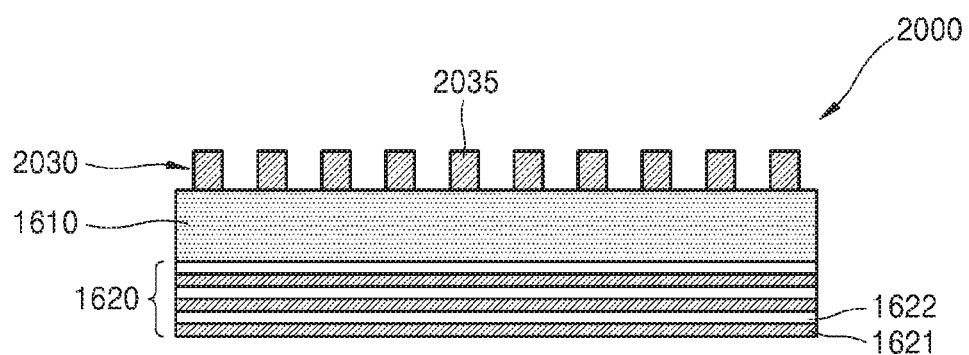

FIG. 25A is a plan view illustrating a filter unit 2000 according to an example embodiment, and FIG. 25B is a cross-sectional view illustrating the filter unit 2000 shown in FIG. 25A. The filter unit 2000 shown in FIGS. 25A and 25B is the same as the filter unit 2000 shown in FIGS. 20A and 20B except that each of reflection structures 2035 of a pattern reflection layer 2030 has a tetragonal cross-sectional surface.

Figure 26A:
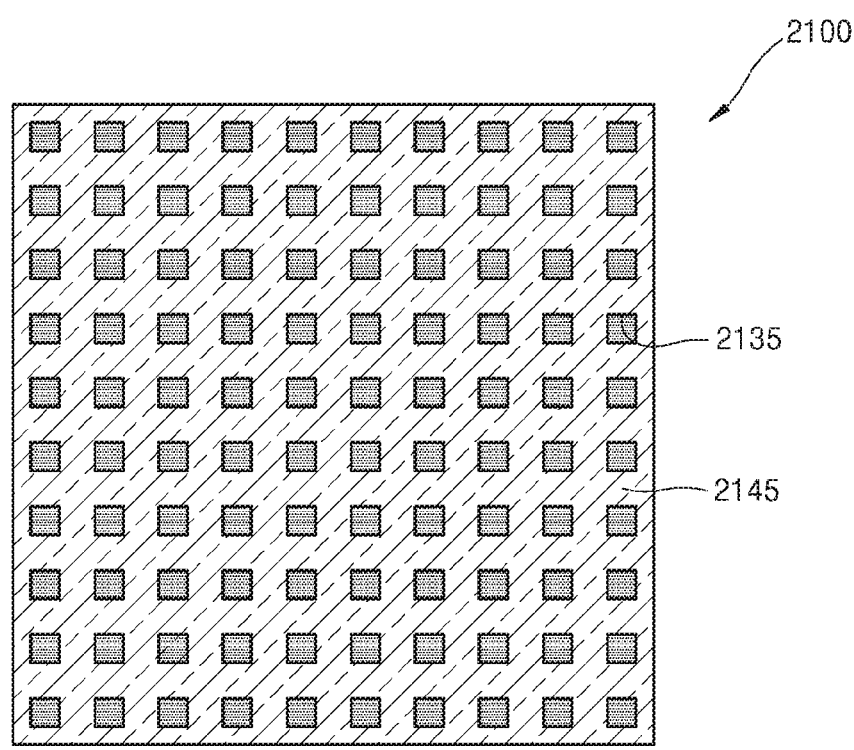
FIGS. 26A and 26B are views illustrating a filter unit according to an example embodiment.
Figure 26B:
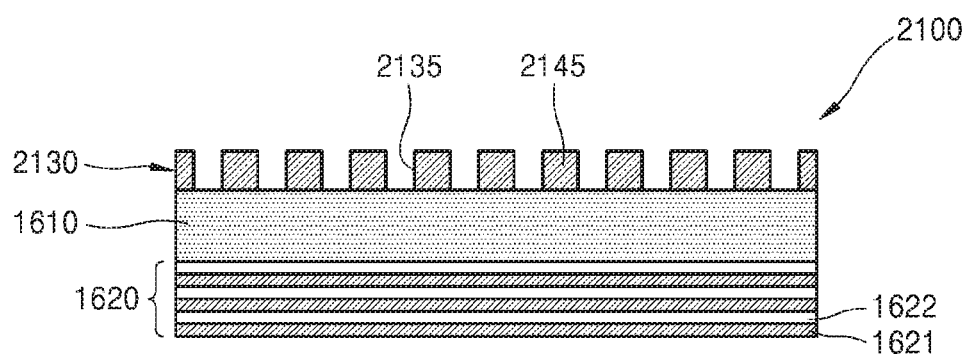

FIG. 26A is a plan view illustrating a filter unit 2100 according to an example embodiment, and FIG. 26B is a cross-sectional view illustrating the filter unit 2100 shown in FIG. 26A. The filter unit 2100 shown in FIGS. 26A and 26B is the same as the filter unit 900 shown in FIGS. 14A and 14B except that each of holes 2135 formed in a pattern material layer 2130 has a tetragonal cross-sectional shape.

According to the example embodiments, a pattern reflection layer including periodic structures causing GMR is provided to a filter unit, thereby increasing reflectance in a narrow wavelength range and reducing variations in resonance wavelength caused by variations in the incident angle of light. In addition, filter units having different resonance wavelengths may be implemented by varying the pitch, thickness, or duty cycle of reflection structures of pattern reflection layers, and thus it may be possible to simplify manufacturing processes of a light filter and reduce manufacturing costs and time.

It should be understood that embodiments described herein should be considered in a descriptive sense only and not for purposes of limitation. Descriptions of features or aspects within each example embodiment should typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A light filter comprising:
a plurality of filter units having different resonance wavelengths,
wherein each of the plurality of filter units comprises:
a cavity layer configured to output light of constructive interference;
a Bragg reflection layer provided on a first surface of the cavity layer; and
a pattern reflection layer provided on a second surface of the cavity layer opposite to the first surface and configured to cause guided mode resonance of light incident on the pattern reflection layer, the pattern reflection layer comprising a plurality of reflection structures that are periodically arranged,
wherein the pattern reflection layer further comprises a filling layer filled in gaps between the plurality of reflection structures, the filling layer being in contact with side surfaces of each of the plurality of reflection structures, and
wherein a refractive index of the filling layer is different from a refractive index of the plurality of reflection structures.

2. The light filter of claim 1, wherein the plurality of reflection structures are periodically arranged with a pitch less than a resonance wavelength of each of the plurality of filter units.

3. The light filter of claim 1, wherein a resonance wavelength of each of the plurality of filter units is determined by at least one of a pitch, a thickness, and a duty cycle of the plurality of reflection structures, the duty cycle of the plurality of reflection structures being a ratio between a width of each of the plurality of reflection structures and the pitch of each of the plurality of reflection structures.

4. The light filter of claim 1, wherein the plurality of reflection structures are arranged one-dimensionally.

5. The light filter of claim 4, wherein the plurality of reflection structures are arranged in parallel lines.

6. The light filter of claim 1, wherein the plurality of reflection structures are arranged two-dimensionally.

7. The light filter of claim 6, wherein the plurality of reflection structures are repeatedly arranged in a polygonal pattern.

8. The light filter of claim 1, wherein the Bragg reflection layer comprises a plurality of material layers respectively having different refractive indexes that are alternately stacked.

9. The light filter of claim 1, wherein the pattern reflection layer further comprises a plurality of connection layers configured to connect adjacent reflection structures, and
wherein a thickness of each of the plurality of connection layers is less than a thickness of the plurality of reflection structures.

10. A spectrometer comprising:
a light filter comprising a plurality of filter units, the plurality of filter units having different resonance wavelengths; and
a sensor configured to receive light that has passed through the light filter,
wherein each of the plurality of filter units comprises:
a cavity layer configured to output light of constructive interference;
a first Bragg reflection layer provided on a first surface of the cavity layer; and
a pattern reflection layer comprising a plurality of reflection structures that are provided on a second surface of the cavity layer opposite to the first surface or included in the cavity layer, the pattern reflection layer being configured to cause guided mode resonance of light incident on the pattern reflection layer,
wherein the plurality of reflection structures are provided on the second surface of the cavity layer,
wherein the pattern reflection layer further comprises a filling layer filled in gaps between the plurality of reflection structures, the filling layer being in contact with side surfaces of each of the plurality of reflection structures, and
wherein a refractive index of the filling layer is different from a refractive index of the plurality of reflection structures.

11. The spectrometer of claim 10, wherein the plurality of reflection structures are periodically arranged with a pitch less than a resonance wavelength of each of the plurality of filter units.

12. The spectrometer of claim 10, wherein a resonance wavelength of each of the plurality of filter units is determined by at least one of a pitch, a thickness, and a duty cycle of the plurality of reflection structures, the duty cycle of the plurality of reflection structures being a ratio between a width of each of the plurality of reflection structures and the pitch of each of the plurality of reflection structures.

13. The spectrometer of claim 10, wherein the plurality of reflection structures are arranged one-dimensionally or two-dimensionally.

14. The spectrometer of claim 10, wherein the plurality of reflection structures are provided in the cavity layer, and
wherein each of the plurality of filter units further comprises a second Bragg reflection layer provided on the second surface of the cavity layer.

15. The spectrometer of claim 14, wherein the plurality of reflection structures are in contact with the first Bragg reflection layer and the second Bragg reflection layer.

16. The spectrometer of claim 10, wherein the sensor comprises an image sensor or a photodiode.

* * * * *